US009905541B2

(12) United States Patent
Ishino et al.

(10) Patent No.: US 9,905,541 B2
(45) Date of Patent: Feb. 27, 2018

(54) SEMICONDUCTOR MODULE WITH BUS BAR INCLUDING STACKED WIRING LAYERS

(71) Applicant: DENSO CORPORATION, Kariya, Aichi-pref. (JP)

(72) Inventors: Hiroshi Ishino, Kariya (JP); Tomokazu Watanabe, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/129,860

(22) PCT Filed: Mar. 26, 2015

(86) PCT No.: PCT/JP2015/001758
§ 371 (c)(1),
(2) Date: Sep. 28, 2016

(87) PCT Pub. No.: WO2015/162856
PCT Pub. Date: Oct. 29, 2015

(65) Prior Publication Data
US 2017/0148770 A1 May 25, 2017

(30) Foreign Application Priority Data

Apr. 25, 2014 (JP) .................................. 2014-91148

(51) Int. Cl.
*H01L 25/07* (2006.01)
*H01L 23/367* (2006.01)
(Continued)

(52) U.S. Cl.
CPC ............ *H01L 25/072* (2013.01); *H01L 23/04* (2013.01); *H01L 23/3121* (2013.01); *H01L 23/3675* (2013.01); *H01L 23/492* (2013.01); *H01L 23/49838* (2013.01); *H01L 24/48* (2013.01); *H01L 25/18* (2013.01); *H02M 7/5387* (2013.01); *H01L 2224/32245* (2013.01); *H01L 2224/33181* (2013.01);
(Continued)

(58) Field of Classification Search
CPC .................... H01L 2224/73265; H01L 25/072
See application file for complete search history.

(56) References Cited

U.S. PATENT DOCUMENTS

2011/0221268 A1* 9/2011 Kanazawa ........... H05K 1/0263
307/10.1
2012/0188712 A1 7/2012 Ishibashi et al.
(Continued)

FOREIGN PATENT DOCUMENTS

JP 2002-017092 A 1/2002
JP 2012-100432 A 5/2012

*Primary Examiner* — Lex Malsawma
*Assistant Examiner* — Xia Cross
(74) *Attorney, Agent, or Firm* — Posz Law Group, PLC

(57) ABSTRACT

A semiconductor module includes upper arms and lower arms for three phases, heat sinks, a main circuit side bus bar, an output terminal side bus bar, a control terminal, and a resin mold portion. The output terminal side bus bar includes U-phase to W-phase wiring layers disposed opposite to each other via an insulating layer and U to W terminals electrically connecting each of the U-phase to W-phase wiring layer and a load. A stacked layer number of the U-phase to W-phase wiring layer is set to be an even number.

10 Claims, 22 Drawing Sheets

(51) Int. Cl.
*H01L 25/18* (2006.01)
*H01L 23/492* (2006.01)
*H01L 23/498* (2006.01)
*H01L 23/31* (2006.01)
*H01L 23/04* (2006.01)
*H01L 23/00* (2006.01)
*H02M 7/5387* (2007.01)
*H02P 27/06* (2006.01)

(52) U.S. Cl.
CPC ............ *H01L 2224/48091* (2013.01); *H01L 2224/48106* (2013.01); *H01L 2224/48247* (2013.01); *H01L 2224/73215* (2013.01); *H01L 2224/73265* (2013.01); *H01L 2924/1203* (2013.01); *H01L 2924/13055* (2013.01); *H01L 2924/13091* (2013.01); *H02P 27/06* (2013.01)

(56) References Cited

U.S. PATENT DOCUMENTS

2013/0241082 A1* 9/2013 Okamura ............. H01L 23/473
 257/777
2014/0091452 A1* 4/2014 Katou .................. H01L 21/565
 257/706

* cited by examiner

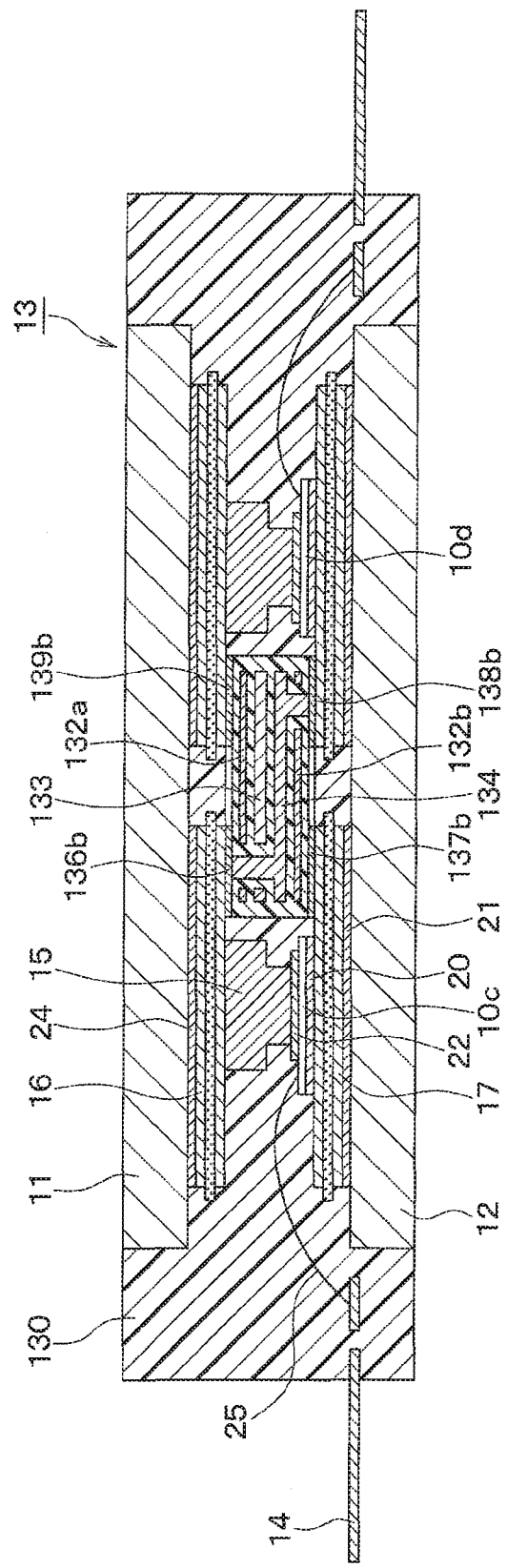

SEMICONDUCTOR MODULE WITH BUS BAR INCLUDING STACKED WIRING LAYERS

CROSS REFERENCE TO RELATED APPLICATIONS

The present disclosure is a U.S. national stage application of International Patent Application No. PCT/JP2015/001758 filed on Mar. 26, 2015 and is based on Japanese Patent Application No. 2014-91148 filed Apr. 25, 2014, the contents of which are incorporated herein by reference.

TECHNICAL FIELD

The present disclosure relates to a semiconductor module including a semiconductor switching element.

BACKGROUND

Patent Literature 1 suggests a structure that can reduce an influence of noise in a power converter including a semiconductor module. The power converter has a structure that connects input and output terminals and a contact terminal drawn out from the semiconductor module to a control substrate at the shortest distances. Accordingly, an inductance of a main circuit that passes the input and output terminals (main circuit inductance) and a control terminal path inductance that passes the control terminal are reduced, and the influence of noise is reduced.

However, in the semiconductor module described in Patent Literature 1, although the distance between the input and output terminals and the control substrate and the distance between the control terminal and the control substrate set to be the shortest, a distance between the input and output terminals and a distance between the input and output terminals and the control terminal are not considered. For example, when a distance between a positive electrode terminal and a negative electrode terminal that become a main terminal corresponding to an input terminal for performing current input in the input and output terminals, the main circuit inductance increases. In addition, when a distance between the main terminal and an alternating-current input terminal for connecting with a load such as a motor, which corresponds to the output terminal in the input and output terminals, is long, this path becomes a noise source. Due to the above-described factors, a reduction of an inductance of a large current path for supplying power to the load is insufficient, and a surge associated with a high-speed operation cannot be restricted. In addition, for example, when distances between the input and output terminals and the control terminal are short, a surge may cause a malfunction, for example, turning on and off of a semiconductor switching element by error (hereafter, referred to as an erroneous-on and an erroneous-off).

PATENT LITERATURE

Patent Literature 1: JP 2012-157161 A

SUMMARY

An object of the present disclosure is to provide a semiconductor module that can reduce an inductance so as to restrict a surge associated with a high speed operation and to restrict a malfunction of a semiconductor switching element.

A semiconductor module according to an aspect of the present disclosure includes upper arms and lower arms for three phases, heat sinks, a main circuit side bus bar, an output terminal side bus bar, a control terminal, and a resin mold portion. Each of the upper arms and the lower arms includes a semiconductor chip in which a semiconductor switching element is formed, and the semiconductor chip has a front surface and a rear surface. The heat sinks are respectively disposed to the front surface and the rear surface of the semiconductor chip in each of the upper arms and the lower arms.

The main circuit side bus bar forms a main circuit including a positive electrode wiring layer, a positive electrode terminal, a negative electrode wiring layer, and a negative electrode terminal. The positive electrode wiring layer is connected to positive electrode sides of the semiconductor chips in the upper arms. The positive electrode terminal electrically connects the positive electrode wiring layer and a positive electrode side of an external power source. The negative electrode wiring layer is disposed opposite to the positive electrode wiring layer via an insulating layer and is connected to negative electrode sides of the semiconductor chips in the lower arms. The negative electrode terminal is electrically connected with the negative electrode wiring layer.

The output terminal side bus bar includes an output wiring layer and an output terminal. The output wring layer is connected to negative electrode sides of the semiconductor chips in the upper arms and positive electrode sides of the semiconductor chips in the lower arms so as to be connected to middle potential points of the upper arms and the lower arms. The output terminal electrically connects the output wiring layer and a load.

The control terminal becomes a signal line of the semiconductor switching elements. The resin mold portion covers the upper arms and the lower arms while exposing one surface of each of the heat sinks, an end portion of the main circuit side bus bar adjacent to the positive electrode terminal and the negative electrode terminal, an end portion of the output terminal side bus bar adjacent to the output terminal, and an end portion of the control terminal.

The output wiring layer includes a U-phase wiring layer, a V-phase wiring layer, and a W-phase wiring layer connected to the middle potential point of the upper arm and the lower arm in each of the three phases. The U-phase wiring layer, the V-phase wiring layer, and the W-phase wiring layer are disposed opposite to each other via an insulating layer. The output terminal includes a U terminal, a V terminal, and a W terminal electrically connecting each of the U-phase wiring layer, V-phase wiring layer, and the W-phase wiring layer and the load. A stacked layer number of the U-phase wiring layer, the V-phase wiring layer, and the W-phase wiring layer is set to be an even number.

In this way, in the semiconductor module, the stacked layer number of the U-phase to W-phase wiring layers is set to be an even number. Accordingly, an inductance of the semiconductor module can be reduced, a surge associated with a high speed operation can be restricted, and a malfunction of the semiconductor switching elements can be restricted.

BRIEF DESCRIPTION OF DRAWINGS

The above and other objects, features and advantages of the present disclosure will become more apparent from the following detailed description made with reference to the accompanying drawings. In the drawings:

FIG. 8 is a cross-sectional view viewed from VIII-VIII in FIG. 2;

DETAILED DESCRIPTION

Before describing embodiments of the present disclosure, circumstances of how the inventors arrived at present disclosure will be described by exemplifying a case in which a semiconductor module is used as a three-phase inverter circuit.

Figure 21:
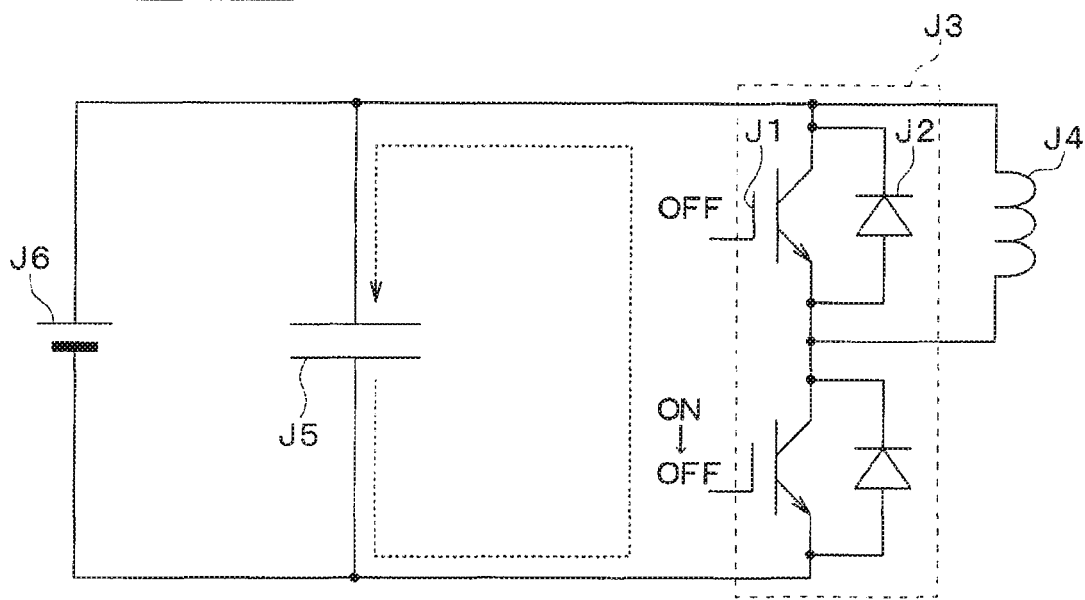
FIG. 21 is a simple model diagram of a circuit to which a bridge circuit J3 constituted of a semiconductor module is applied.

As a simple model shown in FIG. 21, the three-phase inverter circuit includes bridge circuits J3, in which a parallel connection of a semiconductor switching element J1 such as an IGBT and a freewheel diode (hereafter, referred to as FWD) J2 are provided for each of an upper arm and a lower arm, for three phases. The three-phase inverter circuit is connected with a load J4 such as a motor, includes a smoothing capacitor J5 in parallel with the upper arm and the lower arm, and drives the load J4 by power supply from a direct-current power source J6. Specifically, the inverter circuit switches on and off the semiconductor switching elements J1 in the upper arm and the lower arm to convert a direct current supplied from the direct-current power source J6 to an alternating current, and supplies the alternating current to the load J4. A high side terminal (a positive electrode terminal) in the upper arm and a low side terminal (a negative electrode terminal) in the lower arm in this figure corresponds to input terminals of input and output terminals in Patent Literature 1. In addition, an output terminal that performs a current supply to the load J4 corresponds to an alternating-current input terminal in Patent Literature 1, and a gate terminal of the semiconductor switching element J1 provided for each of the arms corresponds to a control terminal of Patent Literature 1.

Figure 22:
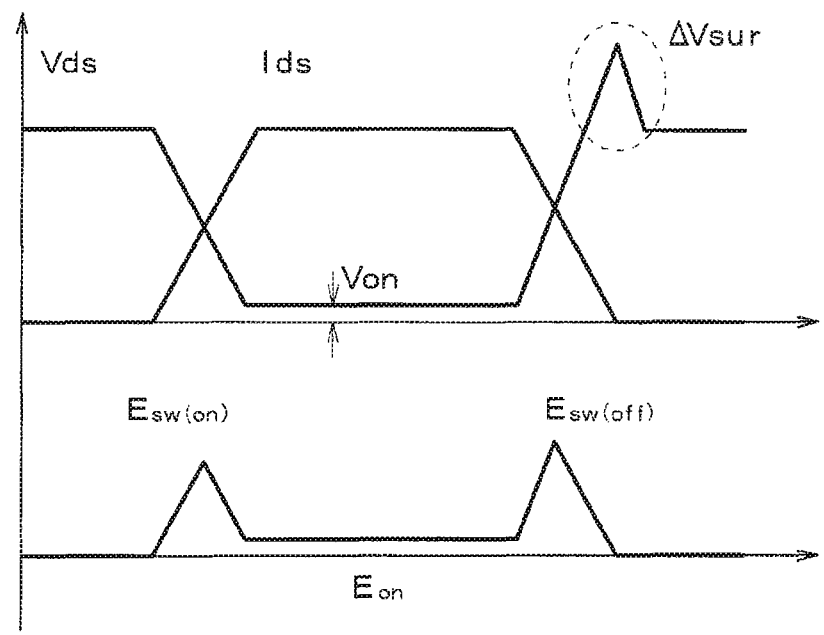
FIG. 22 is a timing diagram showing a state at switching of a semiconductor switching element J1 in the bridge circuit J3.

A drain-source current Ids, a drain-source voltage Vds, and a switching loss Esw when the current supply is performed to the load J4 are shown in FIG. 22.

In the above-described circuit configuration, a short-circuit loop of the upper arm and the lower arm, which is shown by the arrow in FIG. 21, is formed. When the switching element J1 in the lower arm is switched from on to off, a dI/dt change occurs in the short-circuit loop.

As shown in FIG. 22, a surge voltage ΔVsur is generated at switching. The surge voltage ΔVsur is indicated by the following mathematical expression. In the following mathematical expression, L indicates an inductance of the short-circuit loop.

$$\Delta Vsur = L \cdot dI/dt \qquad \text{(Math. 1)}$$

The surge voltage ΔVsur tends to increase due to a promotion of a large current and a high switching speed in recent years. A surge protection is realizable when an element breakdown voltage is set to be high. However, an on-resistance that is in a trade-off relation increases, and an increase of a stationary loss is caused. In addition, there are requirements of reducing the switching loss Esw and reducing a device size, and an improvement of dI/dt and a high frequency are necessary to meet the requirements. Thus, a reduction in inductance of the short-circuit loop is necessary to improve dI/dt without increasing the surge voltage ΔVsur.

Specifically, it is necessary to reduce a main circuit inductance when a path that passes through the upper and lower arms and returns to the smoothing capacitor J5 as shown by the arrow in FIG. 21 is set as a main circuit and to reduce an output terminal induction that is a current supply path to the load J4. In the main circuit, the upper and lower arms are controlled so as not to be turned on at the same time in an inverter control. However, because an upper and lower arm short-circuit occurs from the viewpoint of dI/dt change at switching, when the inductance of the main circuit that becomes an upper and lower short-circuit loop is large, a large surge is generated. At the output terminal, the control circuit works so as to interrupt an electric current of the inverter when an abnormality occurs in the motor. However, when an inductance of an output terminal portion is large, the output terminal portion becomes a noise source and causes a malfunction of the control circuit. Thus, it is necessary to reduce the output terminal inductance as well as the main circuit inductance.

Therefore, in view of the above-described points, it is an object of the present disclosure to reduce an inductance of a semiconductor module and to provide a semiconductor module that can restrict a surge associated with a high-speed operation and can restrict a malfunction of a semiconductor switching element.

The following describes embodiments of the present disclosure with reference to the drawings. In each of the following embodiments, the same or equivalent parts will be described with being designated by the same reference numerals.

First Embodiment

The following describes a first embodiment of the present disclosure. In the present embodiment, as an application example of a semiconductor module according to an embodiment of the present disclosure, a semiconductor module that includes a three-phase inverter circuit driving, for example, a three-phase alternating-current motor will be described.

Figure 1:
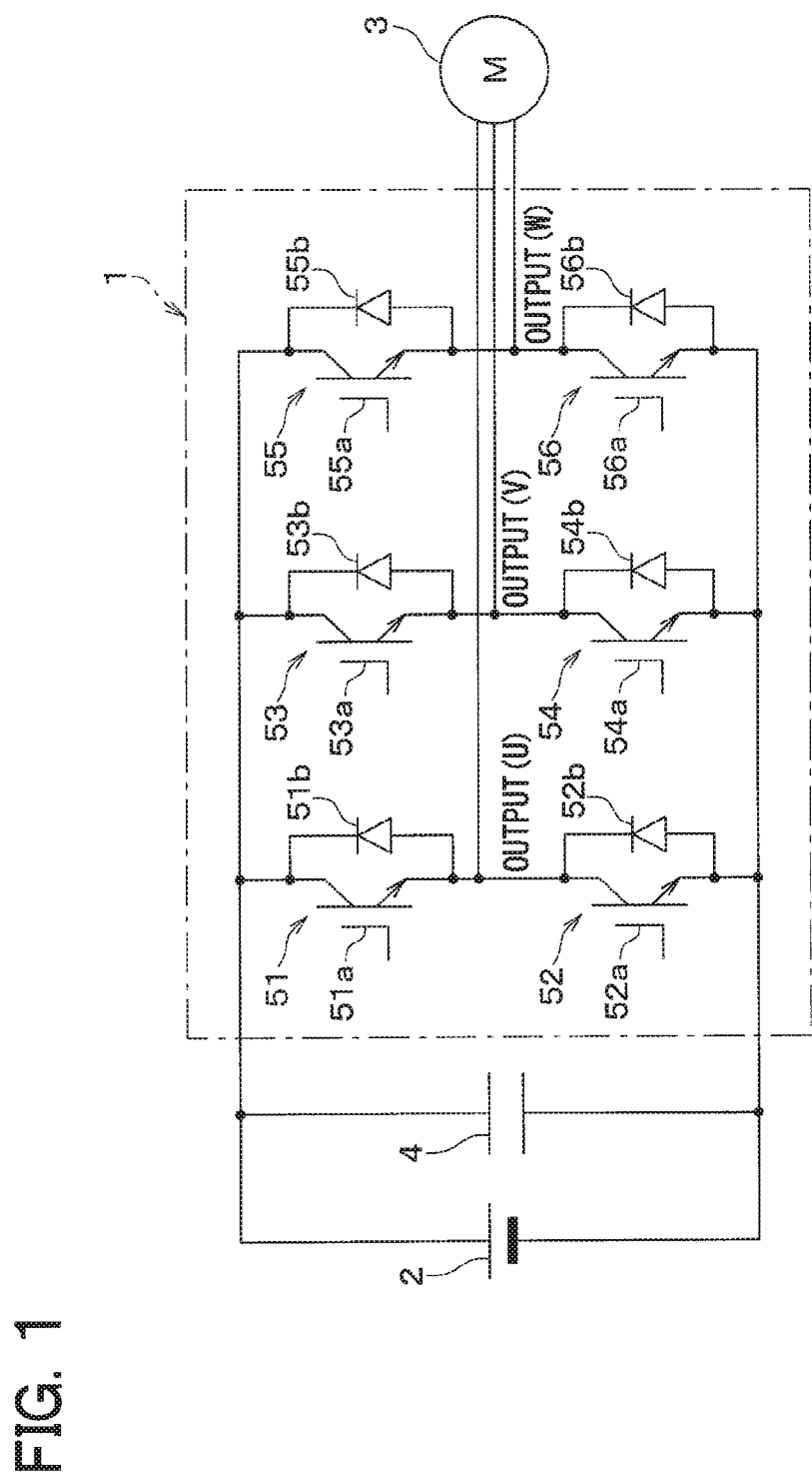
FIG. 1 is a circuit diagram of a three-phase inverter circuit included in a semiconductor module according to a first embodiment of the present disclosure.

First, with reference to FIG. 1, a configuration of a three-phase inverter circuit 1 included in the semiconductor module will be described. As shown in FIG. 1, the three-phase inverter circuit 1 drives a three-phase alternating-current motor as a load 3 based on a direct-current power source (external power source) 2. The three-phase inverter circuit 1 is connected in parallel with a smoothing capacitor 4 so as to form a constant power source voltage by reducing a ripple at switching and restricting an influence of noise.

The three-phase inverter circuit 1 has a configuration in which serially-connected upper and lower arms 51-56 are connected in parallel for three phases. The three-phase inverter circuit 1 applies each of middle potentials between the upper arms 51, 53, 55 and the lower arms 52, 54, 56 to each of a U-phase, a V-phase, and a W-phase of the three-phase alternating-current motor as the load 3 while switching in turn. Specifically, each of the upper and lower arms 51-56 includes a semiconductor switching element 51a-56a such as an IGBT and a MOSFET and a rectifier (one-side conductive element) 51b-56b such as a FWD for back flow current. On-off states of the semiconductor switching elements 51a-56a of each of the phases are controlled so as to supply three-phase alternating currents having different periods to the three-phase alternating-current motor. Accordingly, the three-phase alternating-current motor can be driven.

In the present embodiment, semiconductor chips in which the semiconductor switching elements 51a-56a and the rectifiers 51b-56b respectively constituting six upper and lower arms 51-56 that constituting the three-phase inverter circuit 1 are formed are modulized to be integrated. That is, the three-phase inverter circuit 1 is configured as the semiconductor module having a 6-in-1 structure in which six arms are integrated.

Next, a detailed structure of the semiconductor module that includes the three-phase inverter circuit 1 having the above-described circuit configuration will be described with reference to FIG. 2 to FIG. 6.

Figure 2:
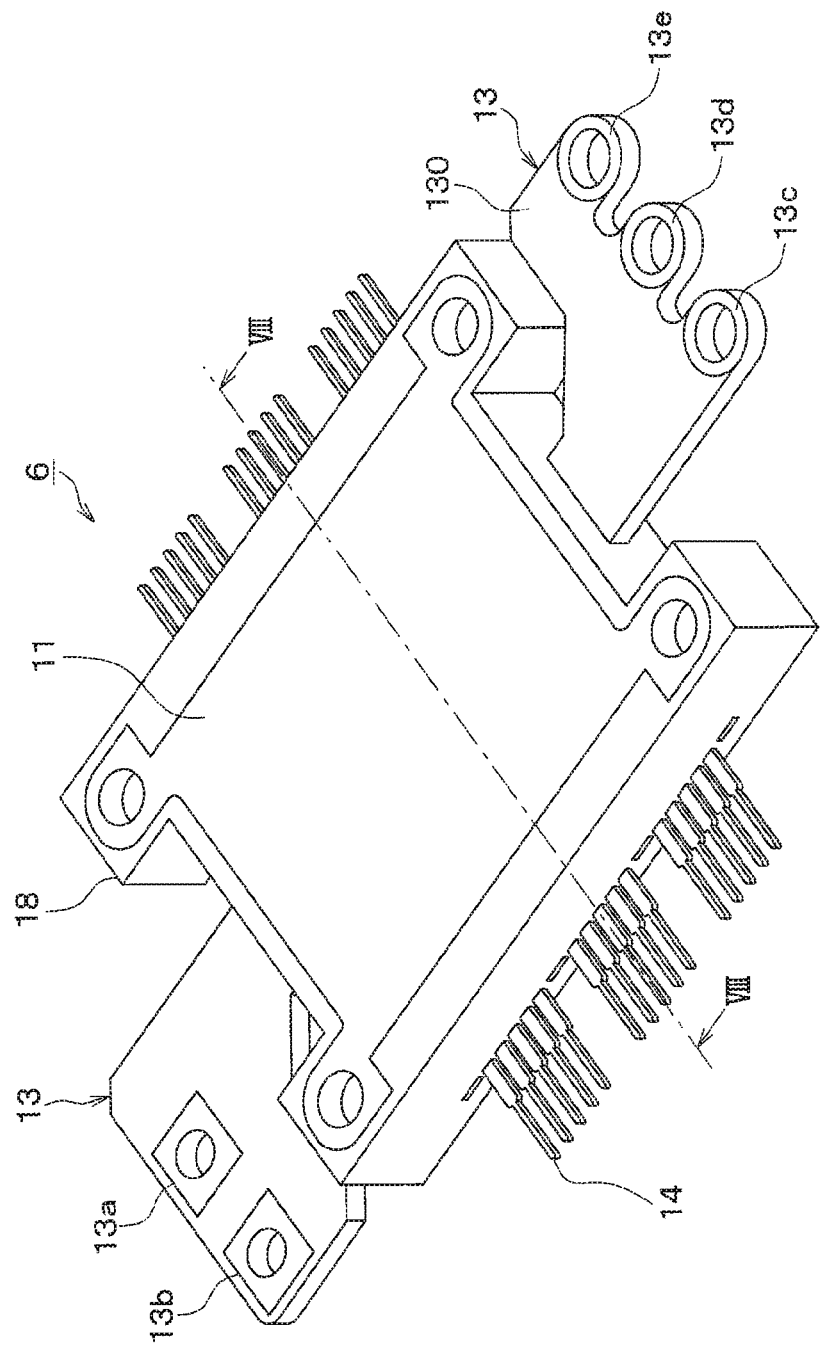
FIG. 2 is a perspective view of the semiconductor module.
Figure 4:
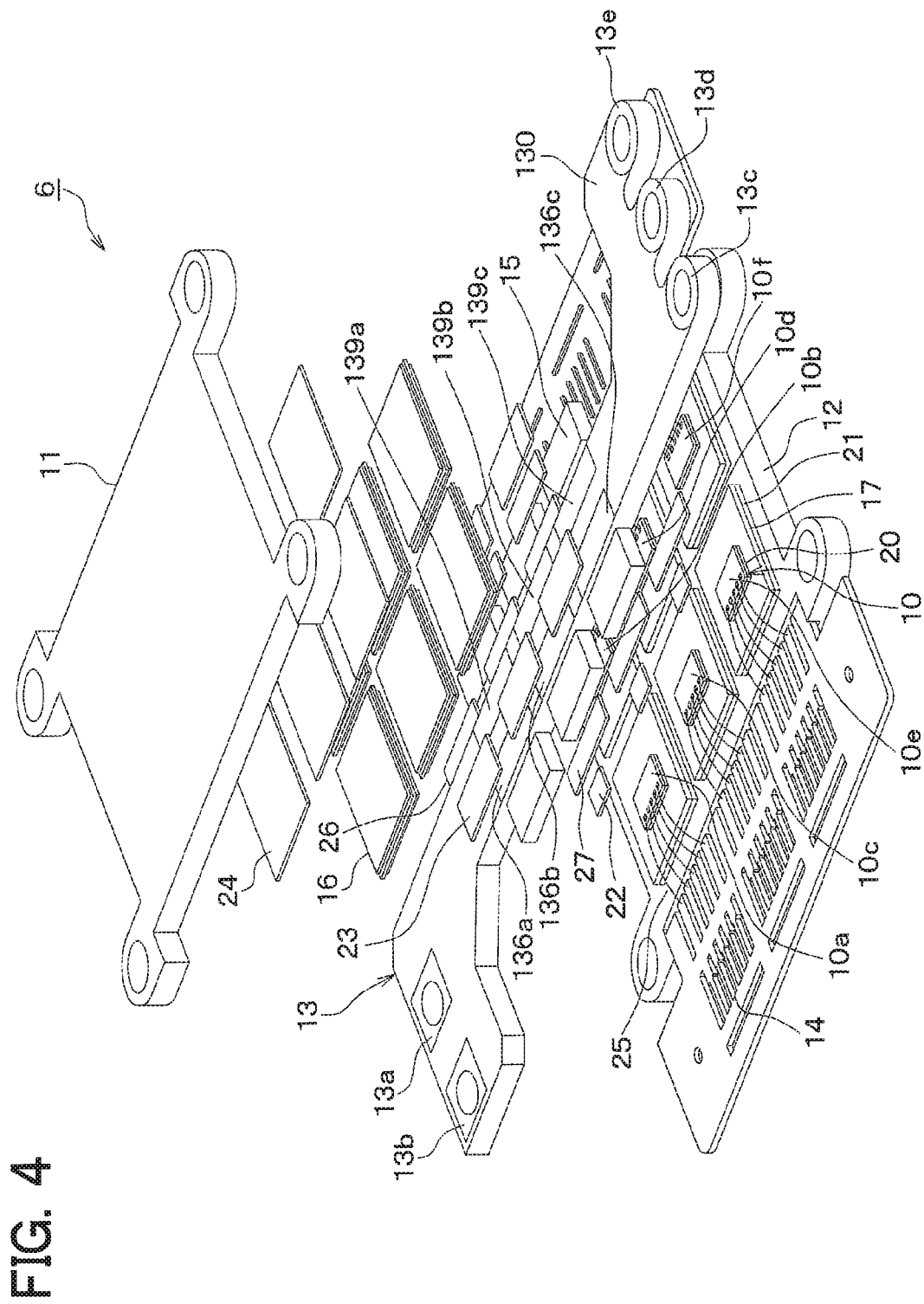
FIG. 4 is an exploded perspective view of components of the semiconductor module.
Figure 5:
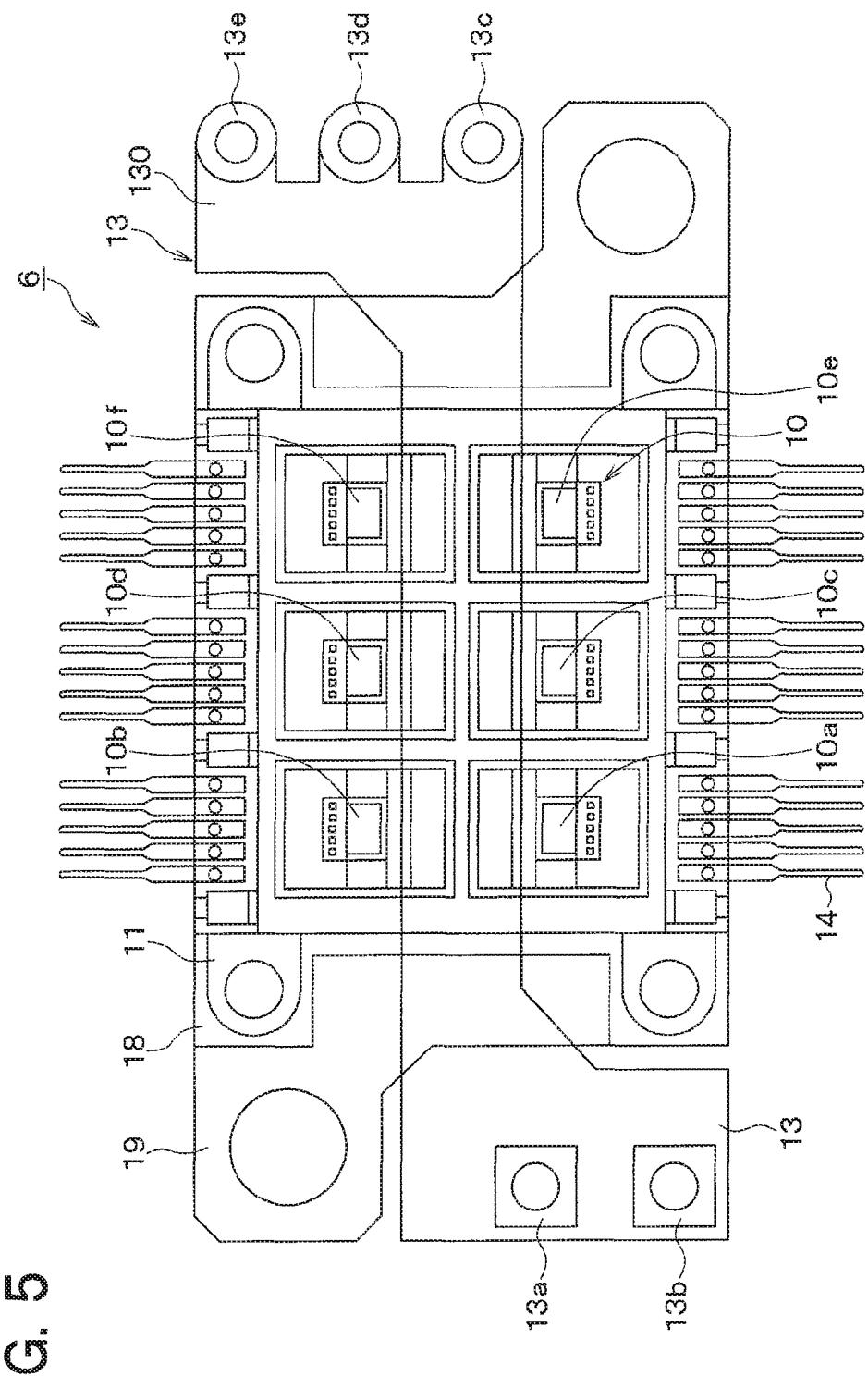
FIG. 5 is a top layout diagram of the semiconductor module.

A semiconductor module 6 shown in FIG. 2 includes semiconductor chips 10, an upper heat sink 11, a lower heat sink 12, a multilayer wiring bus bar 13 in which various terminals and wirings are integrated, control terminals 14, element relay electrodes 15, and plates 16, 17 as shown in FIG. 4. In the above-described components, the semiconductor chip 10, the control terminal 14, the element relay electrode 15, and the plates 16, 17 are set as a component block for one arm, and six component blocks are provided. The six components blocks are sandwiched with the multilayer wiring bus bar 13 by the upper heat sink 11 and the lower heat sink 12, and are covered by a resin mold portion 18. In this way, the semiconductor module 6 is configured as a plate-shape member having a predetermined thickness as shown in FIG. 2. Both sides in the thickness direction of the semiconductor module 6 are sandwiched by cooling devices 19 so that the semiconductor module 6 drives the load 3 while releasing heat. Cooling pipes that form coolant passages not shown are respectively inserted into through holes 19a provided at two points of each of the cooling devices 19. Accordingly, the cooling devices 19 are cooled, and thereby the semiconductor module 6 is used with an efficient cooling.

The following describes a detailed structure of the semiconductor module. Although detailed structures of the component blocks for six arms covered by the resin mold portion 18 are slightly different from each other, basic structures are similar. First, each of components that constitute the basic structures of the component blocks covered by the resin mold portion 18 will be described.

The semiconductor chips 10 shown in FIG. 4 have front surfaces and rear surfaces, and the semiconductor switching elements 51a-56a and the rectifiers 51b-56b that constitute the upper arms 51, 53, 55 are the lower arms 52, 54, 56 are formed in the semiconductor chips 10. For example, the semiconductor chips 10 are formed using semiconductor substrates such as Si, SiC, GaN as base substrates. In the present embodiment, the semiconductor switching elements 51a-56a and the rectifiers 51b-56b are formed as vertical elements that let electric current flow in a vertical direction of the substrate. Various electrodes (pads) are formed on the front surfaces and the rear surfaces of the semiconductor chips 10 and electrical connections are enabled via the electrodes. In a case of the present embodiment, the rear surface of each of the semiconductor chips 10 is electrically and physically connected to a front surface of the lower plate 17 via a joining material 20 made of a high-temperature conductive material such as a solder or an Ag sintered material. A rear surface of the lower plate 17 is joined to the lower heat sink 12 via a joining material 21 made of a high-temperature conductive material such as a solder and an Ag sintered material.

The front surface of the semiconductor chip 10 is connected to the element relay electrode 15 that is made of, for example, Cu, Al, or Fe as a base material via a joining material 22 made of a high-temperature conductive material such as a solder or an Ag sintered material. Furthermore, the element relay electrode 15 is electrically and physically connected to the rear surface of the upper plate 16 via a joining material 23 made of a high-temperature conductive material such as a solder or an Ag sintered material. The upper plate 16 is joined to the upper heat sink 11 via a joining material 24 made of a high-temperature conductive material such as a solder or an Ag sintered material.

By the above-described structure, each of the semiconductor chips 10 is sandwiched by the upper heat sink 11 and the lower heat sink 12.

In the present embodiment, the semiconductor chip 10 has a structure in which elements constituting each of the arms 51-56, such as the semiconductor switching elements 51a-56a and the rectifiers 51b-56b, are formed together in one chip. However, this is merely one example, and elements constituting each of the arms 51-56, such as the semiconductor switching elements 51a-56a and the rectifiers 51b-56b, may be formed in different chips.

Each of the upper heat sink 11 and the lower heat sink 12 corresponds to a heat sink and is made of a high-temperature conductive material mainly including, for example, Cu, Al, or Fe. One surface of each of the upper heat sink 11 and the lower heat sink 12 faces the semiconductor chips 10 and the other surface is exposed from the resin mold portion 18 as shown in FIG. 2. The upper heat sink 11 and the lower heat sink 12 are insulated from the semiconductor chips 10 because the upper plates 16 and the lower plates 17 are partially made of insulating materials. However, because the upper plates 16, the lower plates 17, and the element relay electrodes 15 are made of the high-temperature conductive materials, the upper heat sink 11 and the lower heat sink 12 can release heat from the semiconductor chips 10 with a high thermal conductivity. Specifically, the front surface of the upper heat sink 11 and the rear surface of the lower heat sink 12, that is, both surfaces opposite from the surfaces to which the semiconductor chips 10 are disposed are exposed from the resin mold portion 18, and the heat is released from the exposed portion.

The multilayer wiring bus bar 13 is a portion that constitutes various wirings and various terminals in the semiconductor module 6 according to the present embodiment. In the present embodiment, the multilayer wiring bus bar 13 is made of a plate-shaped and rod-shaped member and is disposed so as to pass between the semiconductor chips 10 that constitute the upper arms 51, 53, 55 of the respective phases and the semiconductor chips 10 that constitute the lower arms 52, 54, 56. For example, the multilayer wiring bus bar 13 includes a positive electrode side wiring that connects the upper arms 51, 53, 55 and a plus terminal of the direct-current power source 2, a negative electrode side wiring that connects the lower arms 52, 54, 56 and a minus terminal of the direct-current power source 2, and an output wiring that connects each of the arms 51-56 and the load 3. In addition, the multilayer wiring bus bar 13 includes various connection terminals 13a-13e for connecting wirings to the direct-current power source 2 and the load 3. The multilayer wiring bus bar 13 is a portion that constitutes a main feature of the present application. A detailed structure of the multilayer wiring bus bar 13 will be described later.

The control terminals 14 are signal terminals that constitute various signal lines such as gate wirings of the semiconductor switching elements 51a-56a. For example, the control terminals 14 are electrically connected to electrodes that are connected to the gates of the semiconductor switching elements 51a-56a formed to the front surfaces of the semiconductor chips 10 via bonding wires 25 (see FIG. 4). End portions of the control terminals 14 opposite from the semiconductor chips 10 are exposed from the resin mold portion 18 as shown in FIG. 2, and a connection with an external device is performed via the exposed portions. In FIG. 4, the control terminals 14 are described in such a manner that the control terminals 14 are integrated in a lead frame state and are also integrated with the lower heat sink 12. However, the control terminals 14 are divided when becoming a final product, and each of the signal lines becomes an independent state.

The element relay electrodes 15 are members electrically connected to the upper plate 16 while the surfaces of the element relay electrodes 15 adjacent to the semiconductor chips 10 are electrically connected with the electrodes on the front surfaces of the semiconductor chips 10. The element relay electrodes 15 are provided so as to make a space in which the bonding wires 25 are disposed between the semiconductor chips 10 and the upper plate 16. The element relay electrodes 15 are made of a high-temperature conductive member mainly including, for example, Cu.

The upper plates 16 serve a function of insulating the semiconductor chips 10 and the upper heat sink 11 while the surfaces of the upper plates 16 adjacent to the semiconductor chips 10 are electrically connected with the electrodes on the front surfaces of the semiconductor chips 10 via the element relay electrodes 15. Similarly, the lower plates 17 serve a function of insulating the semiconductor chips 10 and the lower heat sink 12 while the surfaces of the lower plates 17 adjacent to the semiconductor chips 10 are electrically connected with the electrodes on the rear surfaces of the semiconductor chips 10.

The surfaces of the upper plates 16 and the lower plates 17 adjacent to the semiconductor chips 10 are made of a high-temperature conductive material including Cu or Al as a base material so as to enhance a thermal conductivity in addition to an electrical connection. Layers of the upper plates 16 and the lower plates 17 located on opposite sides from the surfaces adjacent to the semiconductor chips 10 are made of, for example, inorganic or organic insulating material so as to enhance a thermal conductivity while insulating. For example, the upper plates 16 and the lower plates 17 can be formed by sticking conductive plates that include Cu as a base material to both surfaces a ceramic insulating body such as $Si_3N_4$, AlN, or $Al_2O_3$. The upper plates 16 and the lower plates 17 can also be formed by sticking a Cu plate on which an insulating sheet is stuck and an adhesive sheet having an insulation adhesive function with a die bond plate made of a conductive material such as Cu.

By the above-described configuration, the upper plates 16 are connected with front surface electrodes of the semiconductor switching elements 51a-56a (for example, sources of MOSFETs or emitters of IGBTs) and first electrodes of the rectifiers 51b-56b (for example, anodes of FWDs). In addition, the upper plates 16 are also electrically connected with electrodes included in the multilayer wiring bus bar 13. Similarly, the lower plates 17 are connected with rear surface electrodes of the semiconductor switching elements 51a-56a (for example, drains of MOSFETs or collectors of IGBTs) and second electrodes of the rectifiers 51b-56b (for example, cathodes of FWDs). In addition, the lower plates 17 are also connected with electrodes included in the multilayer wiring bus bar 13. Thus, the upper plates 16 and the lower plates 17 constitute a part of the positive electrode side wiring, the negative electrode side wiring and the output wiring with respect to each of the arms 51-56.

Figure 3:
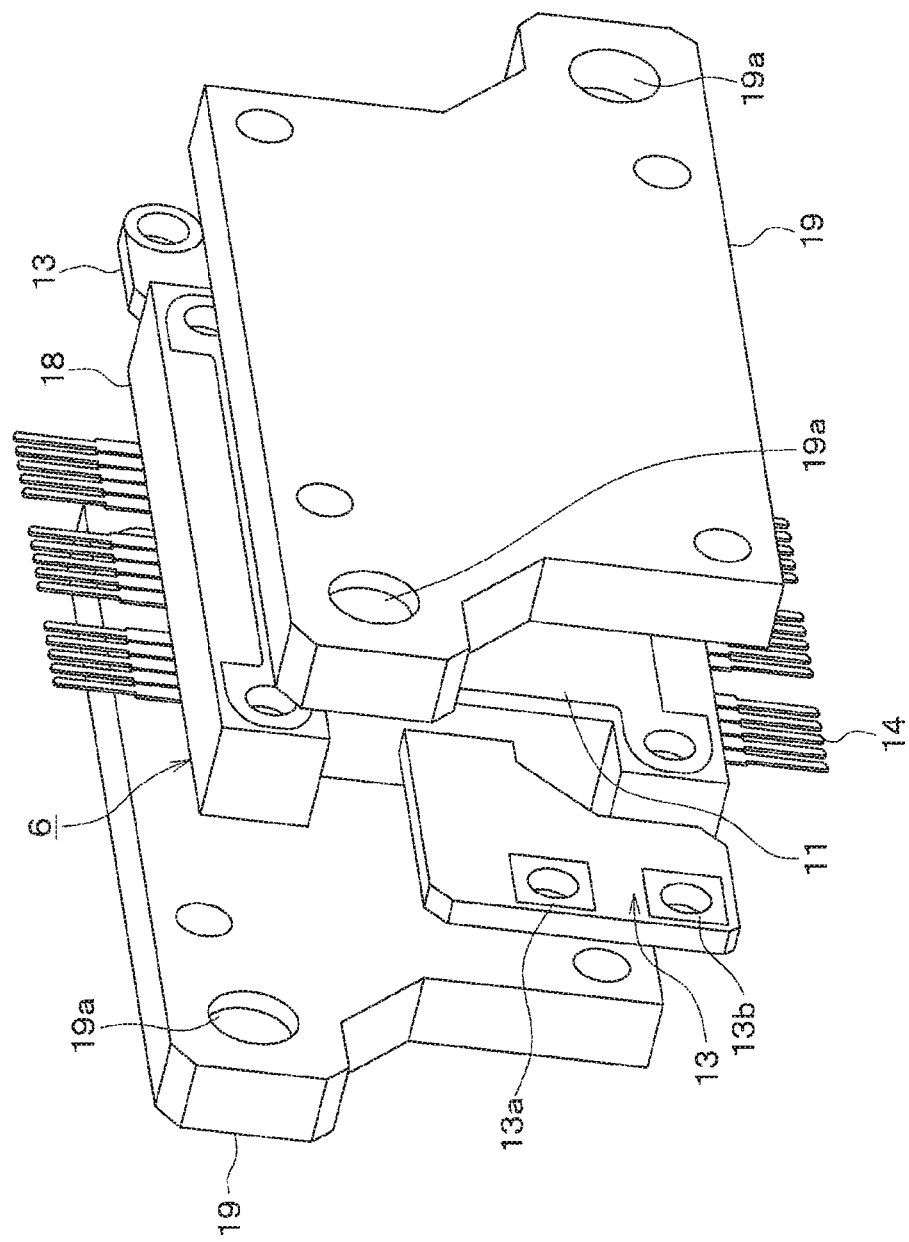
FIG. 3 is a perspective view showing a state in which both surfaces of the semiconductor module are sandwiched by cooling devices.

As described above, the front surface of the upper heat sink 11 and the rear surface of the lower heat sink 12, that is, the surfaces opposite from the surfaces to which the semiconductor chips 10 are disposed are exposed from the resin mold portion 18, and the heat is released from the exposed portion. These heat sinking planes are in contact with the cooling devices 19 as shown in FIG. 3. However, because the upper heat sink 11 and the lower heat sink 12 are insulated from the semiconductor chips 10 by the upper plates 16 and the lower plates 17, a generation of a current leakage to outside through the upper heat sink 11 and the lower heat sink 12 can be prevented.

The resin mold portion 18 is a sealing resin that is formed by filling a resin in a molding tool after disposing the above-described components in the molding tool, and has, for example, a quadrangular plate shape. The resin mold portion 18 is made of a resin that has an insulation property and has a linear expansion coefficient and a Young's modulus lower than conductive portions such as the upper heat sink 11 and the lower heat sink 12. For example, the resin mold portion 18 can be mainly made of an organic resin such as epoxy or silicone. The ends of the control terminals 14 and both ends of the multilayer wiring bus bar 13 are exposed from sides of the quadrangular plate shape of the resin mold portion 18 so as to be electrically connected with external devices. Specifically, the control terminals 14 of the upper arms 51, 53, 55 and the control terminals 14 of the lower arms 52, 54, 56 are exposed from two opposed sides of the resin mold portion 18 having the quadrangular plate shape, that is, to opposite directions sandwiching the resin mold portion 18. In addition, the both ends of the multilayer wiring bus bar 13 are respectively exposed from two opposed sides of the resin mold portion 18 having the quadrangular plate shape, that is to opposite directions sandwiching the resin mold portion 18. In addition, the upper heat sink 11 and the lower heat sink 12 are respectively exposed from front and rear surfaces of the quadrangular plate shape so that the heat can be released excellently.

Specifically, each of the above-described parts is mounted on the front surface of the lower heat sink 12 in a lead frame state to which the control terminals 14 are integrated. After the semiconductor chips 10 and the control terminals 14 are electrically connected with bonding wires 25, the upper heat sink 11 is mounted thereon. These are disposed in the molding tool in this state, and the resin is inject into the molding tool and is molded to form the resin mold portion 18. Because the resin mold portion 18 covers portions except for exposed portions of the control terminals 14 and the multilayer wiring bus bar 13 in addition to the surfaces of the upper heat sink 11 and the lower heat sink 12, the semiconductor chips 10 and the like are protected.

The semiconductor module 6 according to the present embodiment has the above-described structure. Next, a detailed structure of the multilayer wiring bus bar 13 will be described with reference to FIG. 6, FIG. 7A to FIG. 7K.

Figure 6:
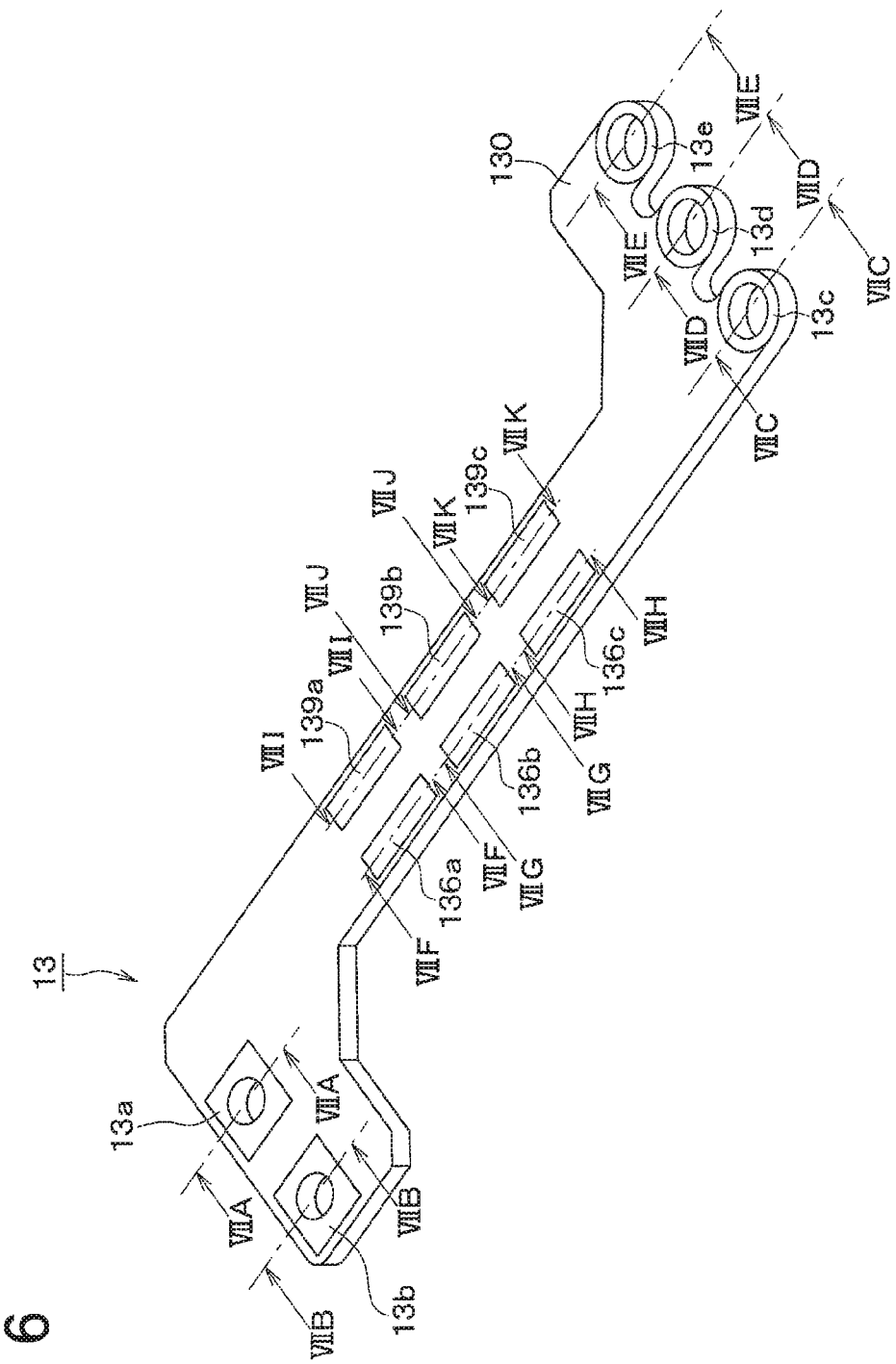
FIG. 6 is a perspective view of a multilayer wiring bus bar.

As described above, the multilayer wiring bus bar 13 constitutes the various wirings and the various terminals of the semiconductor module 6 and is formed by stacking a plurality of conductive layers while sandwiching insulating layers. In a case of the present embodiment, as shown in FIG. 6, the multilayer wiring bus bar 13 is formed of a plate-shaped and rod-shaped member having a longitudinal direction in one direction. As shown in FIG. 2, one end and the other end of the multilayer wiring bus bar 13 are respectively exposed from the two opposed sides of the resin mold portion 18 having the approximately quadrangular shape.

As shown in FIG. 6, at the one end of the multilayer wiring bus bar 13, a positive electrode terminal 13a that connects the upper arms 51, 53, 55 and the plus terminal of the direct-current power source 2 and a negative electrode terminal 13b that connects the lower arms 52, 54, 56 and the minus terminal are formed. At the other end of the multilayer wiring bus bar 13, a U terminal 13c, a V terminal 13d, and a W terminal 13e corresponding to output terminals that connect middle potential points of the upper and lower arms 51-56 of each of the U-phase, the V-phase, and the W-phase, and the load 3 are provided. The positive electrode terminal 13a, the negative electrode terminal 13b, the U terminal 13c, the V terminal 13c, the W terminal 13e are exposed from the resin mold portion 18 as shown in FIG. 2. By the above-described configuration, the semiconductor module 6 is electrically connected with the direct-current power source 2 and the smoothing capacitor 4 via the positive electrode terminal 13a and the negative electrode terminal 13b. In addition, electrical connections with the U-phase, the V-phase, and the W-phase of the three-phase alternating-current motor as the load 3 are provided via the U terminal 13c, the V terminal 13d, and the W terminal 13e.

Figure 7A:
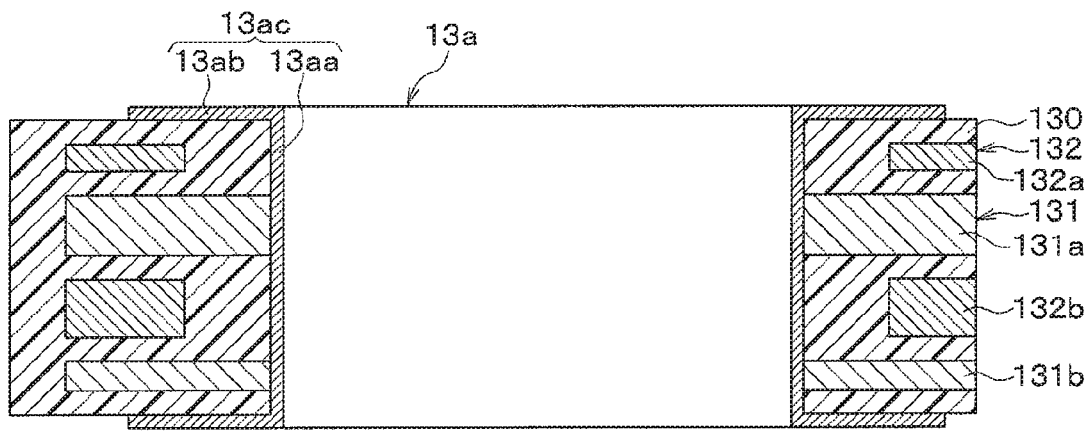
FIG. 7A is a cross-sectional view viewed from an arrow direction of VIIA-VIIA in FIG. 6.

As shown in FIG. 7A, the positive electrode terminal 13a is constitute of a through hole 13ac. On an inner wall and a periphery of an opening portion of the through hole 13ac, a penetrating inner portion 13aa and a surface conductive layer portion 13ab made of, for example, a Cu-plating are formed. The penetrating inner portion 13aa in the positive electrode terminal 13a is connected with a positive electrode wiring layers 131 having a multilayer structure constituted of internal layer conductors that are stacked while being sandwiched by insulating layers 130. The positive electrode wiring layer 131 constitutes wirings connected to positive electrodes 137a-137c (see FIG. 7G to FIG. 7H) connected to the high side of each of the upper arms 51, 53, 55. In the present embodiment, the stacked layer number of the positive electrode wiring layer 131 is two. When a thickness t of one positive electrode wiring layer 131a is set to 0.5, a thickness t of the other positive electrode wiring layer 131b is set to, for example, 0.25 which is a half of the thickness t of the positive electrode wiring layer 131a.

Figure 7B:
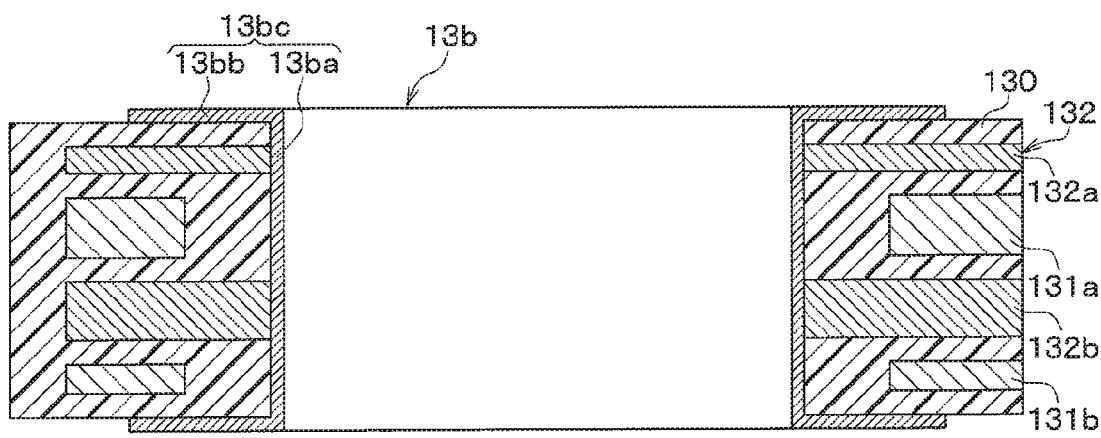
FIG. 7B is a cross-sectional view viewed from an arrow direction of VIIB-VIIB in FIG. 6.

As shown in FIG. 7B, the negative electrode terminal 13b is constituted of a through hole 13bc. On an inner wall and a periphery of an opening portion of the through hole 13bc, a penetrating inner portion 13ba and a surface conductive layer portion 13bb made of, for example, a Cu-plating are formed. The penetrating inner portion 13ba in the negative electrode terminal 13b is connected with a negative electrode wiring layers 132 having a multilayer structure constituted of internal layer conductors that are stacked while being sandwiched by insulating layers 130. The negative electrode wiring layer 132 constitutes wirings connected to negative electrodes 139a-139c (see FIG. 7I to FIG. 7K) connected to the low side of each of the lower arms 52, 54, 56. In the present embodiment, the stacked layer number of the negative electrode wiring layer 132 is two. When a thickness t of one negative electrode wiring layer 132a is set to 0.25, a thickness t of the other negative electrode wiring layer 132b is set to, for example, 0.5 which is a double of the thickness t of the negative electrode wiring layer 132a.

The above-described positive electrode wiring layer 131 and the negative electrode wiring layer 132 are arranged at the one end of the multilayer wiring bus bar 13 in such a manner that the positive electrode wiring layer 131a, the negative electrode wiring layer 132a, the positive electrode wiring layer 131b, the negative electrode wiring layer 132b are arranged in this order from one surface to the other surface of the multilayer wiring bus bar 13. Thus, the negative electrode wiring layer 132a and the positive electrode wiring layer 131b having equal thickness are sandwiched by the positive electrode wiring layer 131a and the negative electrode wiring layer 132 having equal thickness.

Figure 7C:
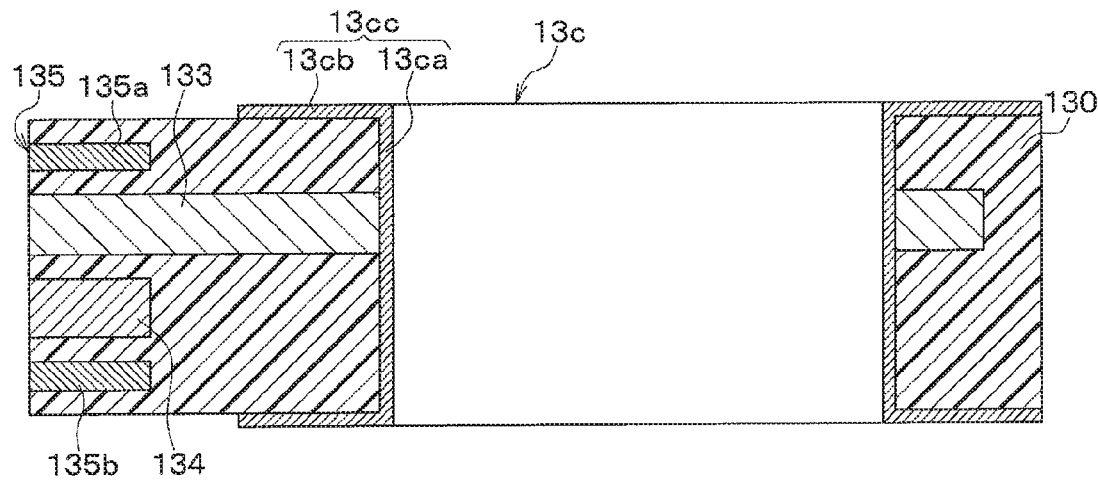
FIG. 7C is a cross-sectional view viewed from an arrow direction of VIIC-VIIC in FIG. 6.

As shown in FIG. 7C, the U terminal 13c is constituted of a through hole 13cc. On an inner wall and a periphery of an opening portion of the through hole 13cc, a penetrating inner portion 13ca and a surface conductive layer portion 13cb made of, for example, a Cu-plating are formed. The penetrating inner portion 13ca in the U terminal 13c is connected with a U-phase wiring layer 133 constituted of internal layer conductors that are stacked while being sandwiched by the insulating layers 130. The U-phase wiring layer 133 constitutes a wiring connected to the middle potential point of the upper and lower arms 51, 52 of the U-phase and the U terminal 13c. The stacked layer number of the U-phase wiring layer 133 is one and the U-phase wiring layer 133 has a thickness of 0.5. In the present embodiment, the U-phase wiring layer 133 is constituted of the same internal conductor as the positive electrode wiring layer 131a.

Figure 7D:
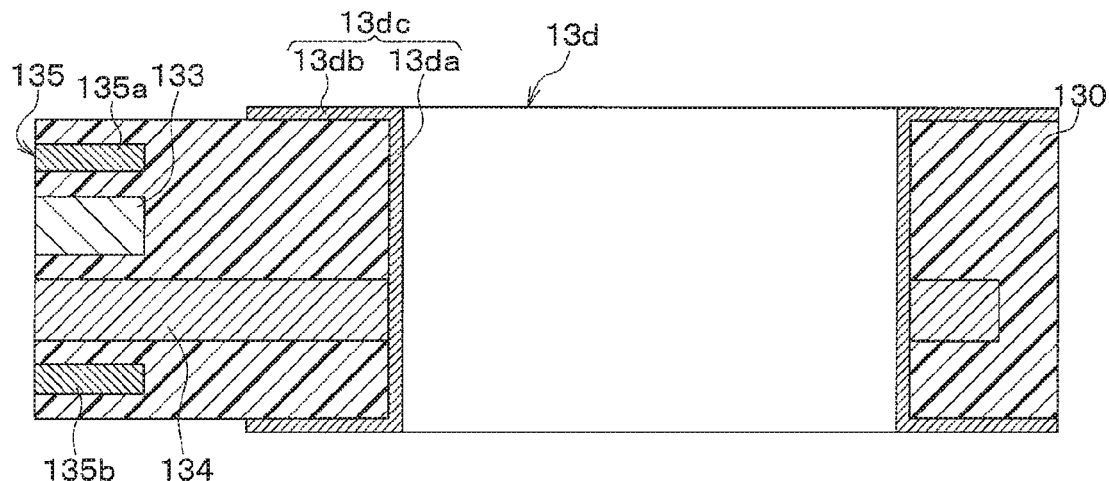
FIG. 7D is a cross-sectional view viewed from an arrow direction of VIID-VIID in FIG. 6.

As shown in FIG. 7D, the V terminal 13d is constituted of a through hole 13dc. On an inner wall and a periphery of an opening portion of the through hole 13dc, a penetrating inner portion 13da and a surface conductive layer portion 13db made of, for example, a Cu-plating are formed. The penetrating inner portion 13da in the V terminal 13d is connected with a U-phase wiring layer 134 constituted of internal layer conductors that are stacked while being sandwiched by the insulating layers 130. The V-phase wiring layer 134 constitutes a wiring connected to the middle potential point of the upper and lower arms 53, 54 of the V-phase and the V terminal 13d. The stacked layer number of the V-phase wiring layer 134 is one and the V-phase wiring layer 133 has a thickness of 0.5. In the present embodiment, the V-phase wiring layer 134 is constituted of the same internal conductor as the negative electrode wiring layer 132b.

Figure 7E:
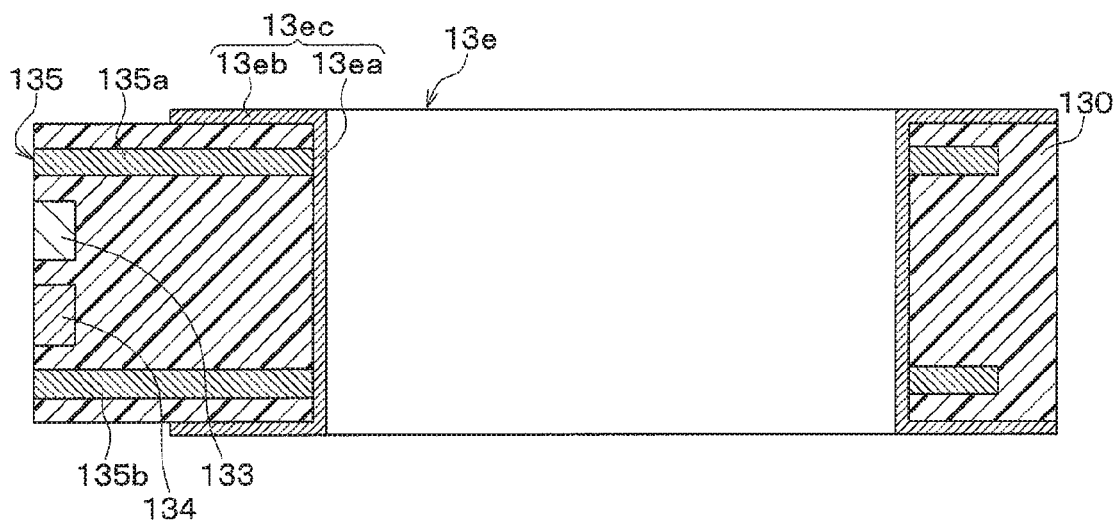
FIG. 7E is a cross-sectional view viewed from an arrow direction of VIIE-VIIE in FIG. 6.

As shown in FIG. 7E, the W terminal 13e is constituted of a through hole 13ec. On an inner wall and a periphery of an opening portion of the through hole 13ec, a penetrating inner portion 13ea and a surface conductive layer portion 13eb made of, for example, a Cu-plating are formed. The penetrating inner portion 13ea in the W terminal 13e is connected with W-phase wiring layers 135 having a multilayer structure constituted of internal layer conductors that are stacked while being sandwiched by the insulating layers 130. The W-phase wiring layers 135 constitute a wiring connected to the middle potential point of the upper and lower arms 55, 56 of the W-phase and the W terminal 13e. The stacked layer number of the W-phase wiring layers 135 is two and the W-phase wiring layers 135 sandwich the U-phase wiring layer 133 and the V-phase wiring layer 134. Each of the W-phase wiring layers 135 has a thickness of 0.25. In the present embodiment, one W-phase wiring layer 135a is constituted of the same internal conductor as the negative electrode wiring layer 132a and the other W-phase wiring layer 135b is constituted of the same internal conductor as the positive electrode wiring layer 131b.

The above-described U-phase to W-phase wiring layers 133-135 are arranged at the other end of the multilayer wiring bus bar 13 in such a manner that the W-phase wiring layer 135a, the U-phase wiring layer 133, the V-phase wiring layer 134, the W-phase wiring layer 135b are arranged in this order from the one surface to the other surface of the multilayer wiring bus bar 13. Thus, the U-phase wiring layer 133 and the V-phase wiring layer 134 having thickness are sandwiched by the W-phase wiring layer 135a and the W-phase wiring layer 135b having equal thickness.

Figure 7F:
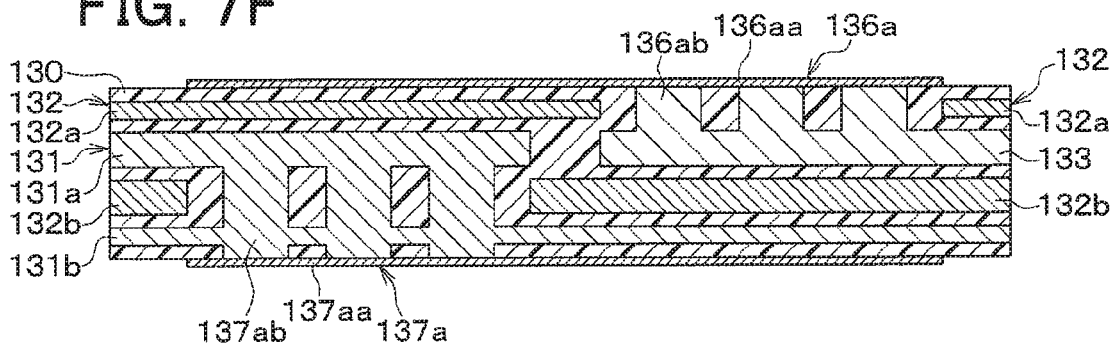
FIG. 7F is a cross-sectional view viewed from an arrow direction of VIIF-VIIF in FIG. 6.

As shown in FIG. 7F, on the positive electrode terminal 13a and the negative electrode terminal 13b side of a front side of the paper at a middle position in the longitudinal direction of the multilayer wiring bus bar 13 shown in FIG. 6, a U electrode 136a is formed on the one surface (the front surface) and the positive electrode 137a is formed on the other surface (the rear surface).

The U electrode 136a corresponds to one of first output electrodes and is electrically connected with the U-phase wiring layer 133. In the present embodiment, the U electrode 136a is constituted of a surface electrode layer 136aa having a rectangular upper-surface shape and a blind via 136ab penetrating the multilayer wiring bus bar 13 from the one surface to the U-phase wiring layer 133 through the insulating layer 130. The U electrode 136a is electrically connected with the low side of the upper arm 51 of the U-phase. Specifically, as shown in FIG. 4, the rear surface of the upper plate 16 corresponding to the semiconductor chip 10a of the upper arm 51 is electrically connected to the U electrode 136a via a joining material 26. Accordingly, the front surface electrode of the semiconductor chip 10a of the upper arm 51 is electrically connected to the U electrode 136a via the joining material 22, the element relay electrode 15, the joining material 23, the upper plate 16, and the joining material 26.

The positive electrode 137a is electrically connected with the positive electrode wiring layer 131. In the present embodiment, the positive electrode 137a is constituted of a surface electrode layer 137aa having a rectangular upper-surface shape and a blind via 137ab penetrating the multilayer wiring bus bar 13 from the other surface to the positive electrode wiring layer 131a through the insulating layer 130. Specifically, as shown in FIG. 4, the front surface of the lower plate 17 corresponding to the semiconductor chip 10a of the upper arm 51 is electrically connected to the positive electrode 137a (not shown in FIG. 4) via a joining material 27. Accordingly, the rear surface electrode of the semiconductor chip 10a of the upper arm 51 is electrically connected to the positive electrode 137a via the joining material 20, the lower plate 17, and the joining material 27.

Figure 7G:
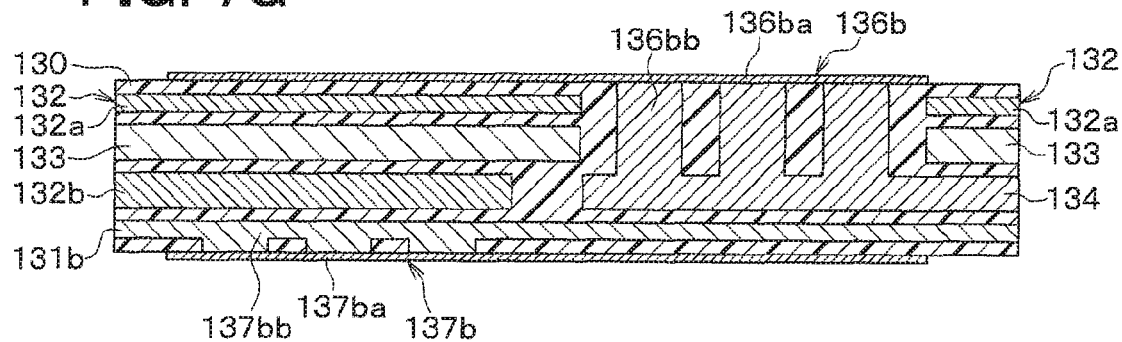
FIG. 7G is a cross-sectional view viewed from an arrow direction of VIIG-VIIG in FIG. 6.

As shown in FIG. 7G, a V electrode 136b is formed on the one surface and the positive electrode 137b is formed on the other surface on the front side of the paper at the middle position in the longitudinal direction of the multilayer wiring bus bar 13.

The V electrode 136*b* corresponds to one of the first output electrodes and is electrically connected with the V-phase wiring layer 134. In the present embodiment, the V electrode 136*b* is constituted of a surface electrode layer 136*ba* having a rectangular upper-surface shape and a blind via 136*bb* penetrating the multilayer wiring bus bar 13 from the one surface to the V-phase wiring layer 134 through the insulating layer 130. The V electrode 136*b* is electrically connected with the low side of the upper arm 53 of the V-phase. Specifically, as shown in FIG. 4, the rear surface of the upper plate 16 corresponding to the semiconductor chip 10*c* of the upper arm 53 is electrically connected to the V electrode 136*b* via the joining material 26. Accordingly, the front surface electrode of the semiconductor chip 10*c* of the upper arm 53 is electrically connected to the V electrode 136*b* via the joining material 22, the element relay electrode 15, the joining material 23, the upper plate 16, and the joining material 26.

The positive electrode 137*a* is electrically connected with the positive electrode wiring layer 131. In the present embodiment, the positive electrode 137*b* is constituted of a surface electrode layer 137*ba* having a rectangular upper-surface shape and a blind via 137*bb* penetrating the multilayer wiring bus bar 13 from the other surface to the positive electrode wiring layer 131*b* through the insulating layer 130. Specifically, as shown in FIG. 4, the front surface of the lower plate 17 corresponding to the semiconductor chip 10*c* of the upper arm 53 is electrically connected to the positive electrode 137*b* (not shown in FIG. 4) via the joining material 27. Accordingly, the rear surface electrode of the semiconductor chip 10*c* of the upper arm 53 is electrically connected to the positive electrode 137*a* via the joining material 20, the lower plate 17, and the joining material 27.

Figure 7H:
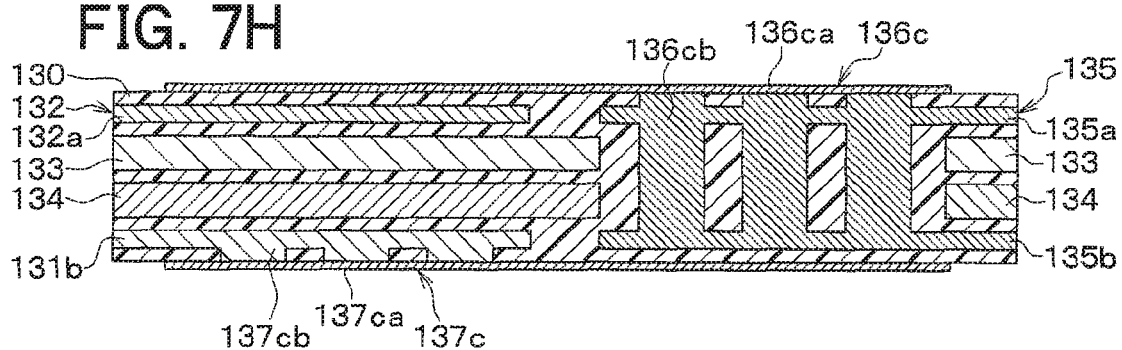
FIG. 7H is a cross-sectional view viewed from an arrow direction of VIIH-VIIH in FIG. 6.

As shown in FIG. 7H, on the U terminal 13*c*, the V terminal 13*d* and the W terminal 13*e* side of the front side of the paper at the middle position in the longitudinal direction of the multilayer wiring bus bar 13 shown in FIG. 6, a W electrode 136*c* is formed on the one surface and the positive electrode 137*a* is formed on the other surface.

The W electrode 136*c* corresponds to one of first output electrodes and is electrically connected with the W-phase wiring layer 135. In the present embodiment, the W electrode 136*c* is constituted of a surface electrode layer 136*ca* having a rectangular upper-surface shape and a blind via 136*cb* penetrating the multilayer wiring bus bar 13 from the one surface to the W-phase wiring layer 135*b* through the insulating layer 130. The W electrode 136*c* is electrically connected with the low side of the upper arm 55 of the W-phase. Specifically, as shown in FIG. 4, the rear surface of the upper plate 16 corresponding to the semiconductor chip 10*e* of the upper arm 55 is electrically connected to the W electrode 136*c* via the joining material 26. Accordingly, the front surface electrode of the semiconductor chip 10*e* of the upper arm 55 is electrically connected to the W electrode 136*c* via the joining material 22, the element relay electrode 15, the joining material 23, the upper plate 16, and the joining material 26.

The positive electrode 137*c* is electrically connected with the positive electrode wiring layer 131. In the present embodiment, the positive electrode 137*c* is constituted of a surface electrode layer 137*ca* having a rectangular upper-surface shape and a blind via 137*cb* penetrating the multi-layer wiring bus bar 13 from the other surface to the positive electrode wiring layer 131*b* through the insulating layer 130. Specifically, as shown in FIG. 4, the front surface of the lower plate 17 corresponding to the semiconductor chip 10*e* of the upper arm 55 is electrically connected to the positive electrode 137*c* (not shown in FIG. 4) via the joining material 27. Accordingly, the rear surface electrode of the semiconductor chip 10*e* of the upper arm 55 is electrically connected to the positive electrode 137*c* via the joining material 20, the lower plate 17, and the joining material 27.

Figure 7I:
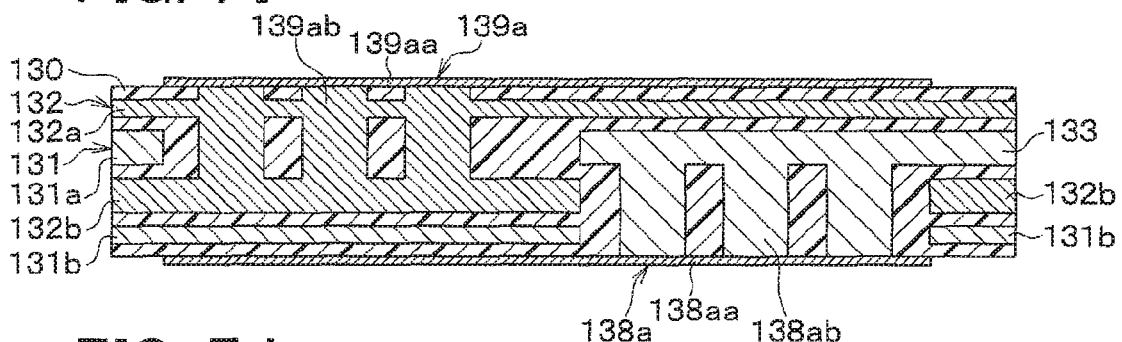
FIG. 7I is a cross-sectional view viewed from an arrow direction of VIII-VIII in FIG. 6.
Figure 7J:
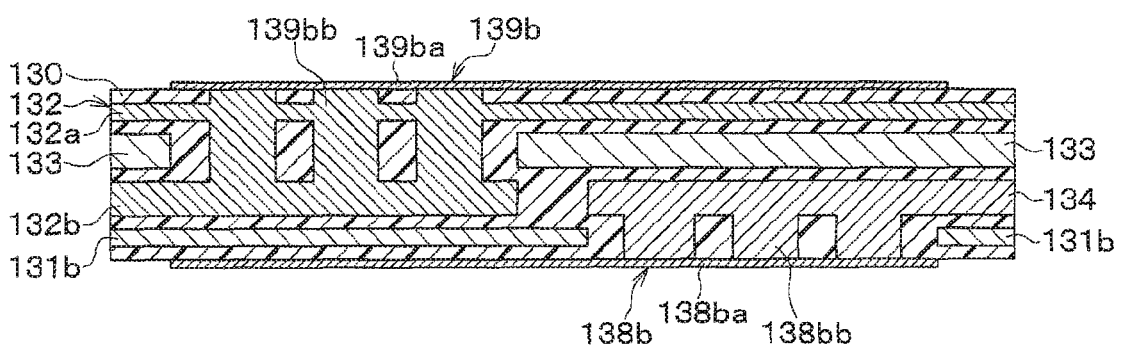
FIG. 7J is a cross-sectional view viewed from an arrow direction of VIIJ-VIIJ in FIG. 6.

As shown in FIG. 7I, on the positive electrode terminal 13*a* and the negative electrode terminal 13*b* side of the back side of the paper at the middle position in the longitudinal direction of the multilayer wiring bus bar 13 shown in FIG. 6, a U electrode 138*a* is formed on the other surface (the rear surface) and the negative electrode 139*a* is formed on the one surface (the front surface).

The U electrode 138*a* corresponds to one of second output electrodes and is electrically connected with the U-phase wiring layer 133. In the present embodiment, the U electrode 138*a* is constituted of a surface electrode layer 138*aa* having a rectangular upper-surface shape and a blind via 138*ab* penetrating the multilayer wiring bus bar 13 from the other surface to the U-phase wiring layer 133 through the insulating layer 130. The U electrode 136*a* is electrically connected with the high side of the lower arm 52 of the U-phase. Specifically, as shown in FIG. 4, the front surface of the lower plate 17 corresponding to the semiconductor chip 10*b* of the lower arm 52 is electrically connected to the U electrode 138*a* (not shown in FIG. 4) via the joining material 27. Accordingly, the rear surface electrode of the semiconductor chip 10*b* of the lower arm 52 is electrically connected to the U electrode 138*a* via the joining material 20, the lower plate 17, and the joining material 27.

The negative electrode 139*a* is electrically connected with the negative electrode wiring layer 132. In the present embodiment, the negative electrode 139*a* is constituted of a surface electrode layer 139*aa* having a rectangular upper-surface shape and a blind via 139*ab* penetrating the multi-layer wiring bus bar 13 from the one surface to the negative electrode wiring layer 132*a* through the insulating layer 130. Specifically, as shown in FIG. 4, the front surface of the upper plate 16 corresponding to the semiconductor chip 10*b* of the lower arm 52 is electrically connected to the negative electrode 139*a* via the joining material 26. Accordingly, the front surface electrode of the semiconductor chip 10*b* of the lower arm 52 is electrically connected to the negative electrode 139*a* via the joining material 22, the element relay electrode 15, the joining material 23, the upper plate 16, and the joining material 26.

As shown in FIG. 7G, a V electrode 138*b* is formed on the other surface and the negative electrode 139*b* is formed on the one surface on the back side of the paper at the middle position in the longitudinal direction of the multilayer wiring bus bar 13 shown in FIG. 6.

The V electrode 138*b* corresponds to one of the second output electrodes and is electrically connected with the V-phase wiring layer 134. In the present embodiment, the V electrode 138*b* is constituted of a surface electrode layer 138*ba* having a rectangular upper-surface shape and a blind via 138*bb* penetrating the multilayer wiring bus bar 13 from the one surface to the V-phase wiring layer 134 through the insulating layer 130. The V electrode 138*b* is electrically connected with the high side of the lower arm 54 of the V-phase. Specifically, as shown in FIG. 4, the front surface of the lower plate 17 corresponding to the semiconductor chip 10*d* of the lower arm 54 is electrically connected to the V electrode 138*b* (not shown in FIG. 4) via the joining material 27. Accordingly, the rear surface electrode of the semiconductor chip 10d of the lower arm 54 is electrically connected to the V electrode 138b via the joining material 20, the lower plate 17, and the joining material 27.

The negative electrode 139b is electrically connected with the negative electrode wiring layer 132. In the present embodiment, the negative electrode 139b is constituted of a surface electrode layer 139ba having a rectangular upper-surface shape and a blind via 139bb penetrating the multilayer wiring bus bar 13 from the one surface to the negative electrode wiring layer 132b through the insulating layer 130. Specifically, as shown in FIG. 4, the front surface of the upper plate 16 corresponding to the semiconductor chip 10d of the lower arm 54 is electrically connected to the negative electrode 139b via the joining material 26. Accordingly, the front surface electrode of the semiconductor chip 10d of the lower arm 54 is electrically connected to the negative electrode 139b via the joining material 22, the element relay electrode 15, the joining material 23, the upper plate 16, and the joining material 26.

Figure 7K:
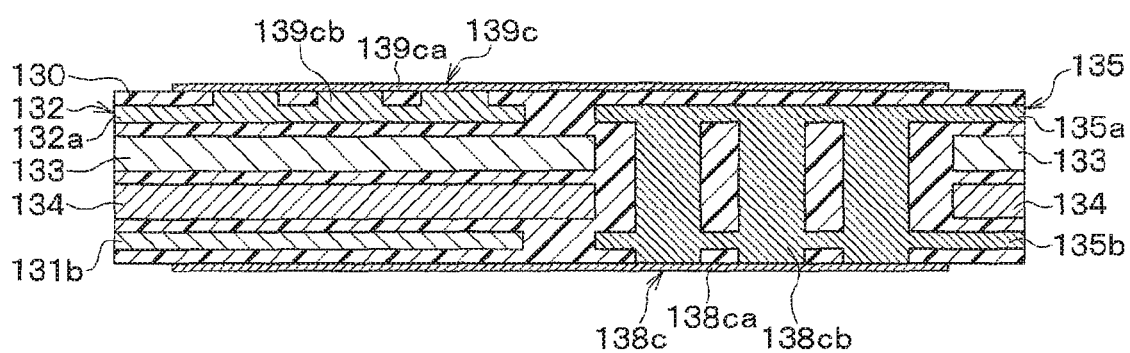
FIG. 7K is a cross-sectional view viewed from an arrow direction of VIIK-VIIK in FIG. 6.

As shown in FIG. 7K, on the U terminal 13c, the V terminal 13d and the W terminal 13e side of the back side of the paper at the middle position in the longitudinal direction of the multilayer wiring bus bar 13 shown in FIG. 6, a W electrode 138c is formed on the other surface and the negative electrode 139a is formed on the one surface.

The W electrode 138c corresponds to one of second output electrodes and is electrically connected with the W-phase wiring layer 135. In the present embodiment, the W electrode 138c is constituted of a surface electrode layer 138ca having a rectangular upper-surface shape and a blind via 138cb penetrating the multilayer wiring bus bar 13 from the other surface to the W-phase wiring layer 135a through the insulating layer 130. The W electrode 138c is electrically connected with the high side of the lower arm 56 of the W-phase. Specifically, as shown in FIG. 4, the front surface of the lower plate 17 corresponding to the semiconductor chip 10f of the lower arm 56 is electrically connected to the W electrode 138c (not shown in FIG. 4) via the joining material 27. Accordingly, the rear surface electrode of the semiconductor chip 10f of the lower arm 56 is electrically connected to the W electrode 138c via the joining material 20, the lower plate 17, and the joining material 27.

The negative electrode 139c is electrically connected with the negative electrode wiring layer 132. In the present embodiment, the negative electrode 139c is constituted of a surface electrode layer 139ca having a rectangular upper-surface shape and a blind via 139cb penetrating the multilayer wiring bus bar 13 from the one surface to the negative electrode wiring layer 132a through the insulating layer 130. Specifically, as shown in FIG. 4, the front surface of the upper plate 16 corresponding to the semiconductor chip 10f of the lower arm 56 is electrically connected to the negative electrode 139c via the joining material 26. Accordingly, the front surface electrode of the semiconductor chip 10f of the lower arm 56 is electrically connected to the negative electrode 139c via the joining material 22, the element relay electrode 15, the joining material 23, the upper plate 16, and the joining material 26.

The multilayer wiring bus bar 13 is formed by the above-described structure. Wiring portions of the three-phase inverter circuit 1 are formed using the multilayer wiring bus bar 13, and components included in the three-phase inverter circuit 1 are electrically connected. For example, as shown in FIG. 8, in the V-phase, the front surface electrode of the semiconductor chip 10c of the upper arm 53 is electrically connected to the V electrode 136b via the joining material 22, the element relay electrode 15, the joining material 23, the upper plate 16, and the joining material 26. In addition, the rear surface electrode of the semiconductor chip 10c of the upper arm 53 is electrically connected to the positive electrode 137b via the joining material 20, the lower plate 17, and the joining material 27. In addition, the rear surface electrode of the semiconductor chip 10d of the lower arm 54 is electrically connected to the V electrode 138b via the joining material 20, the lower plate 17, and the joining material 27. Furthermore, the front surface electrode of the semiconductor chip 10d of the lower arm 54 is electrically connected to the negative electrode 139b via the joining material 22, the element relay electrode 15, the joining material 23, the upper plate 16, and the joining material 26.

In this way, in a cross section of cutting the multilayer wiring bus bar 13 in a width direction (a cross section in FIG. 8), the V electrode 136b and the V electrode 138b are disposed ån one diagonal, and the positive electrode 137b and the negative electrode 139b are disposed on the other diagonal. Then, the V electrode 136b and the V electrode 138b are electrically connected via the internal layer wiring, the front surfaces and the rear surfaces of the semiconductor chips 10c, 10d of the upper and lower arms 53, 54 can be disposed so as to face the same directions. In this way, the components of the semiconductor module 6 are electrically connected via the multilayer wiring bus bar 13. Although the V-phase is taken as an example in FIG. 8, the U-phase and the W-phase have similar cross-sectional structure.

In the multilayer wiring bus bar 13 formed as described above, a stacked layer number of the internal layer conductors constituting the positive electrode wiring layer 131, the negative electrode wiring layer 132, and the U-phase to W phase wiring layers 133-135 are an even number. In the present embodiment, the multilayer wiring bus bar 13 has four-layer structure. That is, in a case of driving the three-phase alternating current motor, a wiring layer of each of the phases connected to the three phases of the U-phase, the V-phase, and the W-phase needs to be formed of one layer. However, because the stacked layer number becomes an odd number, the W-phase wiring layers 135 are divided into two layers so that the stacked layer number becomes an even number. Then, the U-phase wiring layer 133 and the V-phase wiring layer 134 are disposed between the W-phase wiring layers 135 divided into two layers.

In addition, in the internal layer conductors, the thickness of two outer layers are set to be the same while the thicknesses of the two inner layers are set to be the same. Accordingly, the total thickness of the W-phase wiring layers 135 is made correspond to the thicknesses of the U-phase wiring layer 133 and the V-phase wiring layer 134 so that resistance values when electric current flow in the W-phase wiring layers 135, the U-phase wiring layer 133, and the V-phase wiring layer 134 are approximated even when the W-phase wiring layers 135 are divided into two layers. However, because of dividing into two layers, the resistance value of the W-phase may be larger than the resistance values of the U-phase and the V-phase. In such a case, the total thickness of the W-phase needs to be larger than the thicknesses of the U-phase and the V-phase to reduce the resistance value. Thus, the total thickness is not always made correspond.

Each of the positive electrode wiring layer 131 and the negative electrode wiring layer 132 needs to be formed of one layer. However, each of the positive electrode wiring layer 131 and the negative electrode wiring layer 132 is divided into two layers so as have four-layer structure in accordance with the stacked layer number of the U-phase to W-phase wiring layers 133-135. Because of the above-described structure, effects of reducing the main circuit inductance and the output terminal inductance, restricting a surge due to a high-speed operation, and restricting a malfunction of the semiconductor switching elements can be obtained. The following describes reasons for obtaining the above-described effects with reference to experimental results and the like.

In the multilayer wiring bus bar 13 having the above-described structure, basically, the U-phase to W phase wiring layers 133-135 have the stacked structure, and the U-phase wiring layer 133 and the V-phase wiring layer 134 are disposed between the W-phase wiring layers 135 divided into two layers. In addition, the positive electrode wiring layers 131 and the negative electrode wiring layers 132 have stacked structure.

Figure 9A:
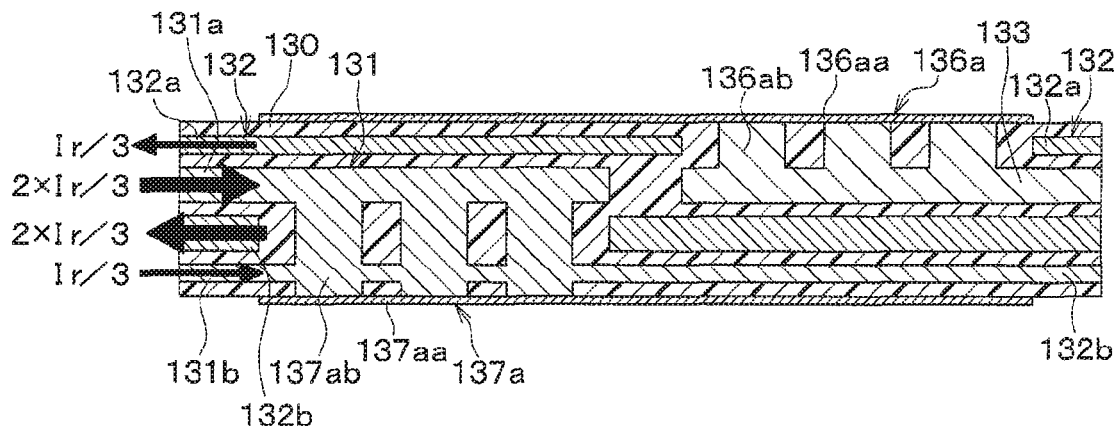
FIG. 9A is a cross-sectional view showing flow of electric currents at a position where a positive electrode wiring layer and a negative electrode wiring layer are staked when the semiconductor module is used.

In this configuration, for example, as shown by arrows in FIG. 9A, at a position where the positive electrode wiring layers 131 and the negative electrode wiring layers 132 are stacked, electric currents flow in opposite directions in the positive electrode wiring layers 131 and the negative electrode wiring layers 132 when the semiconductor module 6 is used. Specifically, in the positive electrode wiring layers 131, ⅔ of the total electric current Ir flows in the positive electrode wiring layer 131a, and ⅓ of the total electric current Ir flows in the positive electrode wiring layer 131b. In the negative electrode wiring layers 132, ⅓ of the total electric current Ir flows in the negative electrode wiring layer 132a, and ⅔ of the total electric current Ir flows to the negative electrode wiring layer 132b. Thus, in the main circuit that passes the main terminals as the positive electrode terminal 13a and the negative electrode terminal 13b, directions of diverted electric currents are opposite to each other, magnetic fluxes counteract, and a mutual inductance is reduced. Then, the electric current is carried to outside while keeping the relation. Accordingly, the main circuit inductance can be reduced.

Figure 9B:
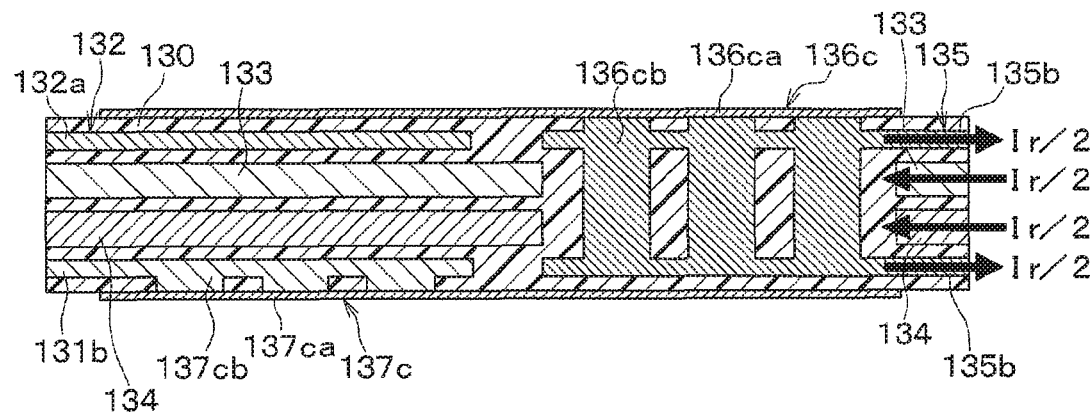
FIG. 9B is a cross-sectional view showing flow of electric currents at a position where U-phase to W-phase wiring layers are formed into a stacked structure when the semiconductor module is used.
Figure 10:
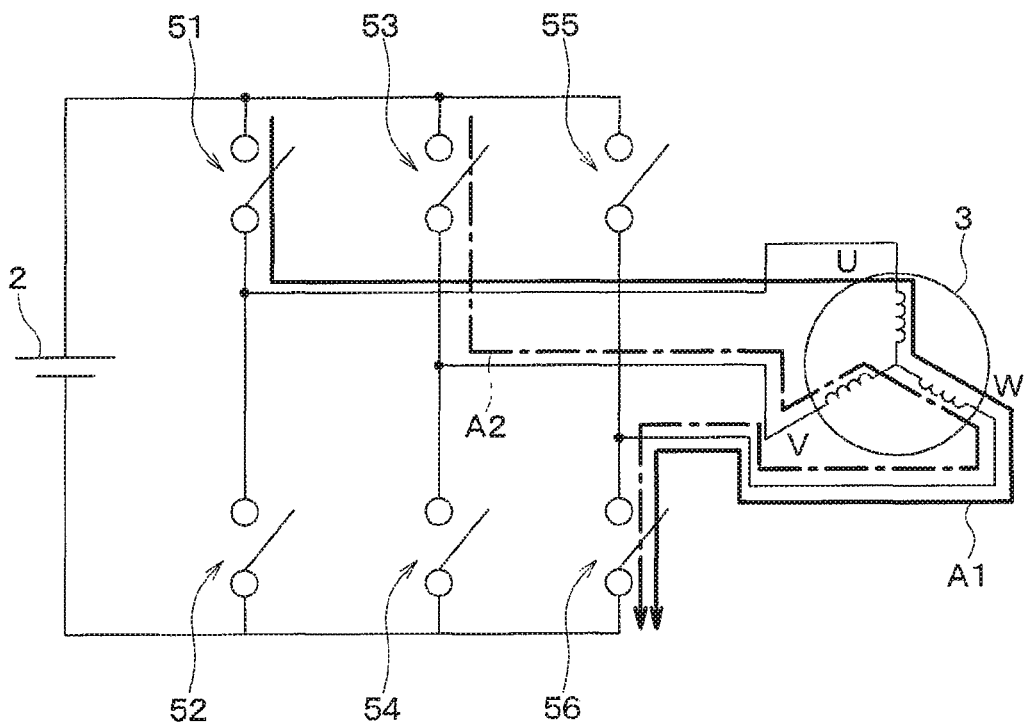
FIG. 10 is a circuit diagram showing an operation of the three-phase inverter circuit.

Similarly, as shown by the arrows in FIG. 9B, at a position where the U-phase to W-phase wiring layers 133-135 have the stacked structure, electric currents flow in opposite directions in the wiring layers. Specifically, in the three-phase inverter circuit 1 that drives the three-phase alternating-current motor as the load 3 as shown in FIG. 10, electric current that respectively flow in the U-phase to the W-phase of the three-phase alternating-current motor are set to Iu, Iv, Iw. In this case, when a current value that flows into the relay point of the three-phase alternating-current motor is indicated as positive and a current value that flows out from relay point is indicated as negative, Iu+Iv+Iw=0 is satisfied at all timings, and on-off states of the arms 51-56 are controlled so as to draw alternating-current waveforms as shown in FIG. 11.

Figure 11:
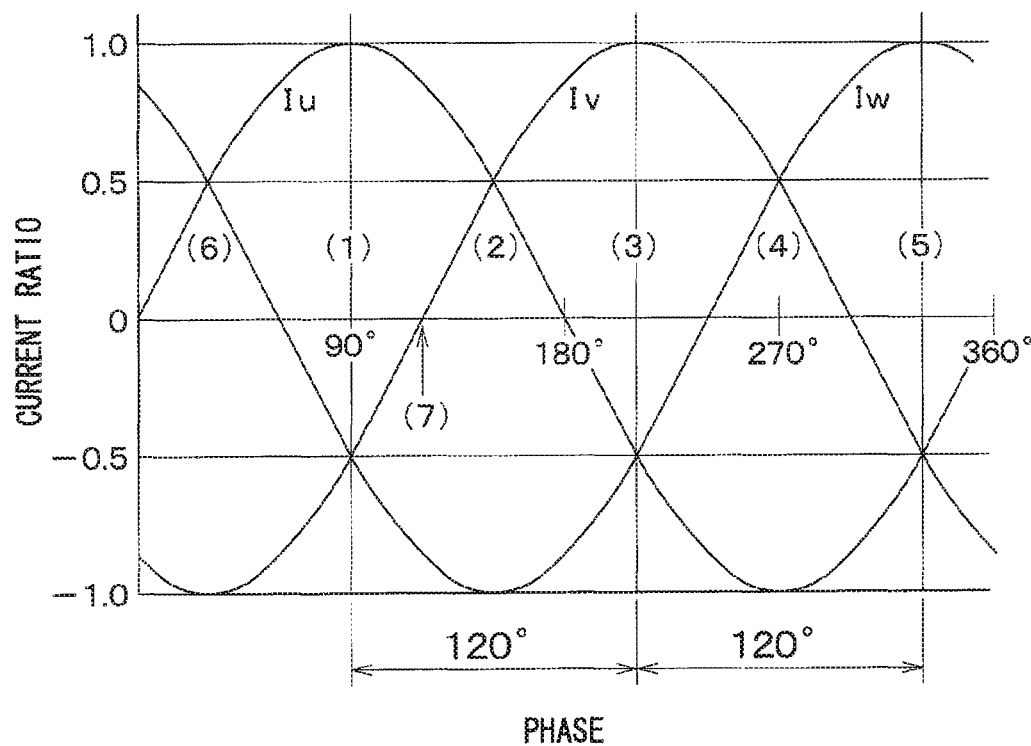
FIG. 11 is a waveform chart of electric currents Iu, Iv, Iw that flow to respective phases of the three-phase inverter circuit.

For example, the arrows A1, A2 in FIG. 10 show flows of electric currents at timing (2) in FIG. 11. At timing (2), the lower arm 56 of the W-phase is turned on while the upper arms 51, 53 of the U-phase and the V-phase are turned on, and the other arms 52, 54, 55 are turned off.

In the three-phase inverter circuit 1 for driving the three-phase alternating-current motor, a mode of operation is classified into three modes. In the first mode, while two of the upper arms 51, 53, 55 are turned on, one of the lower arms 52, 54, 56 which corresponds to the other of the upper arms 51, 53, 55 which is not turned on is turned on (timings (6), (2), (4) in FIG. 11). In the second mode, while one of the upper arms 51, 53, 55 is turned on, two of the lower arms 52, 54, 56 which correspond to the other two of the upper arms 51, 53, 55 which are not turned on are turned on (timings (1), (3), (5) in FIG. 11). In the third mode, while one of the upper arms 51, 53, 55 is turned on, one of the lower arms 52, 54, 56 which corresponds to another of the upper arms 51, 53, 55 which is not turned on is turned on (timing (7) in FIG. 11). The three-phase inverter circuit 1 drives the three-phase alternating-current motor by switching these modes, and the electric current Iu, Iv, Iw draw alternating-current waveforms of the first to three phases (phases 1-3) in which phases are shifted each other by 120°.

Then, when electric currents that flow into the relay point of the three-phase alternating-current motor and electric currents that flow out from the relay point are considered, electric currents flow in opposite directions in all the first to three phases (see FIG. 9B). Thus, an inductance of a large current path for supplying the electric current to the load 3 can be reduced.

Figure 13:
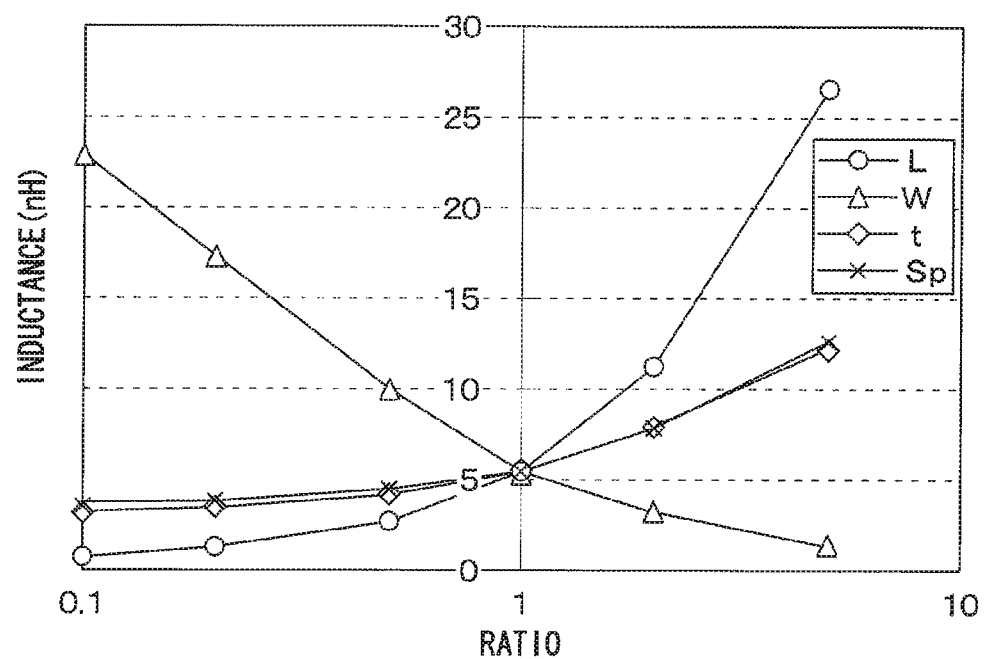
FIG. 13 is a graph showing a result of inventing a change of inductance with respect to a change of a size of each portion of a staked structure of the conductive layers.

Here, in order to confirm the effects of the stacked conductors, specimens having a two-layer structure in which conductive layers 28a, 28b are disposed opposite to each other while providing a space therebetween, and ends of the conductive layers 28a, 28b are connected by a connecting portion 28c made of a conductor are prepared. Then, an electric current is supplied so as to flow from one end of the conductive layer 28a, pass the connecting portion 28c provided at the other end, and pass an end of the conductive layer 28b opposite from the connecting portion 28c. Then, a case where a thickness t, a length L, a width W, and a space Sp of each of the conductive layers 28a, 28b and the connecting portion 28c are predetermined values are set as reference values, and inductances of the specimens are examined while changing the thickness t, the length L, the width W, and the space Sp. Specifically, the reference values of the thickness t, the length L, the width W, and the space Sp are set to 1, and the inductances of the specimens are examined while changing a ratio of one of the values into 0.1, 0.2, 0.5, 1.0, 2.0, 5.0 and maintaining the other values at the reference values. As a result, results shown in FIG. 13 are obtained.

As shown in this figure, the inductance increases as the length L or the thickness t increases. Although it is natural that the mutual inductance increases in accordance with the length L, it can be understood that the inductance increases as the thickness t increases and the inductance can be reduced as the width W increases. From this, it can be said that it is more effective to increase the width W than to increase the thickness t for reducing the inductance in a case where cross-section areas of portions where an electric current passes are the same.

Then, in the present embodiment, the positive electrode wiring layers 131 and the negative electrode wiring layers 132 are formed into plate shapes opposite to each other, and the U-phase to W-phase wiring layers 133-135 are also formed into plate shapes opposite to each other. Thus, as described above, a structure in which a dimension of the width W is larger than the thickness t is provided, and the inductance can be reduced.

Figure 12:
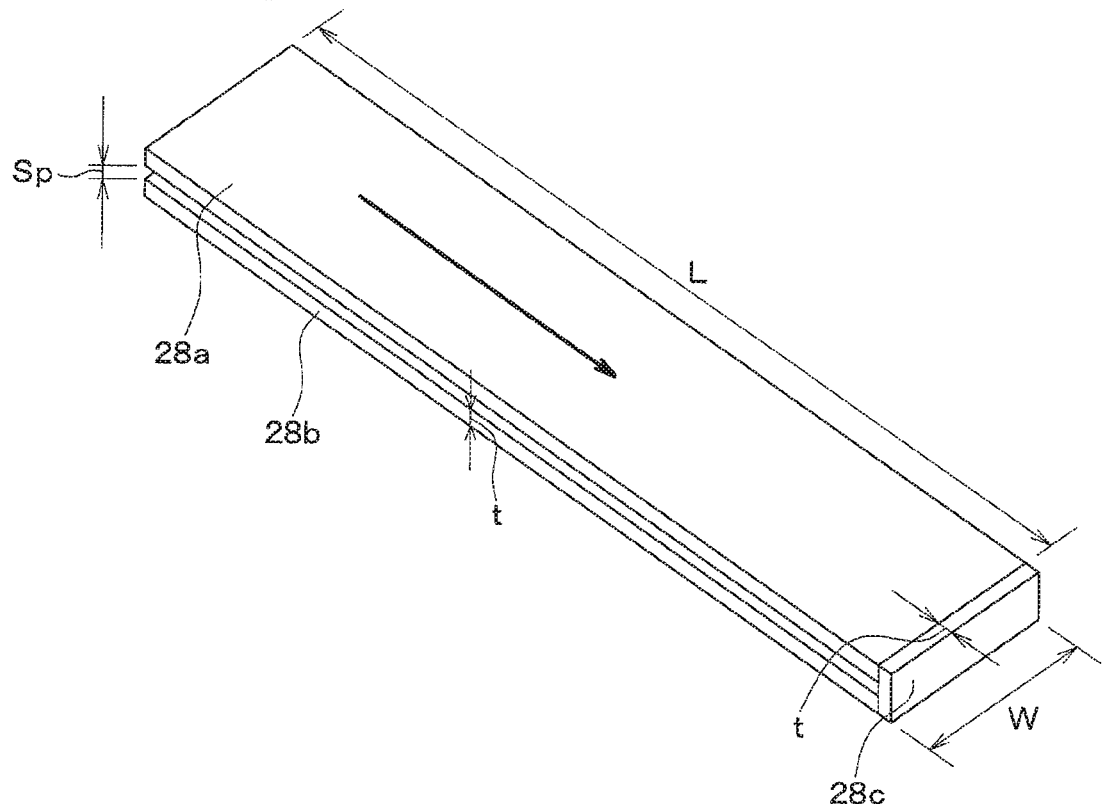
FIG. 12 is a perspective view of a stacked structure of conductive layers used as a specimen.

In addition, also in a case where the positive electrode wiring layer 131 and the negative electrode wiring layer 132, and the U-phase to W-phase wiring layers 133-135 are formed into the four-layer structure like the present embodiment, not a two-layer structure shown in FIG. 12, the above-described effect of reducing the inductance is confirmed. Like the present embodiment, an effect of reducing an inductance is evaluated for a case where thicknesses of two outer layers of internal layer conductors are set to 0.5 with respect to thicknesses 1 of two inner layers.

Figure 14A:
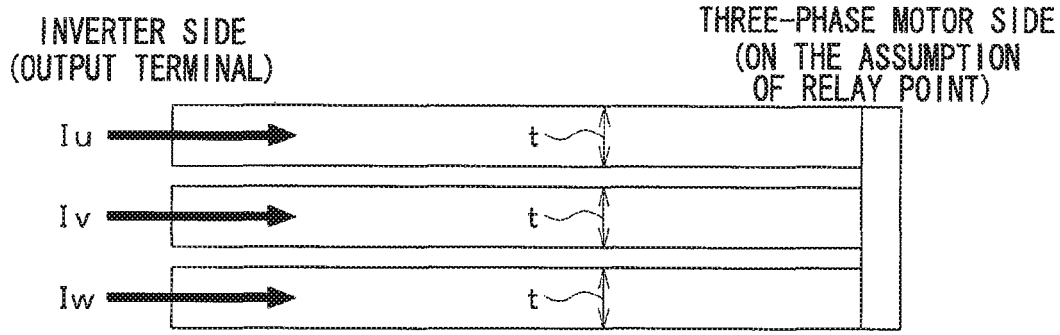
FIG. 14A is a cross-sectional view of a stacked structure of U-phase to W-phase wiring layers used as a specimen.
Figure 14B:
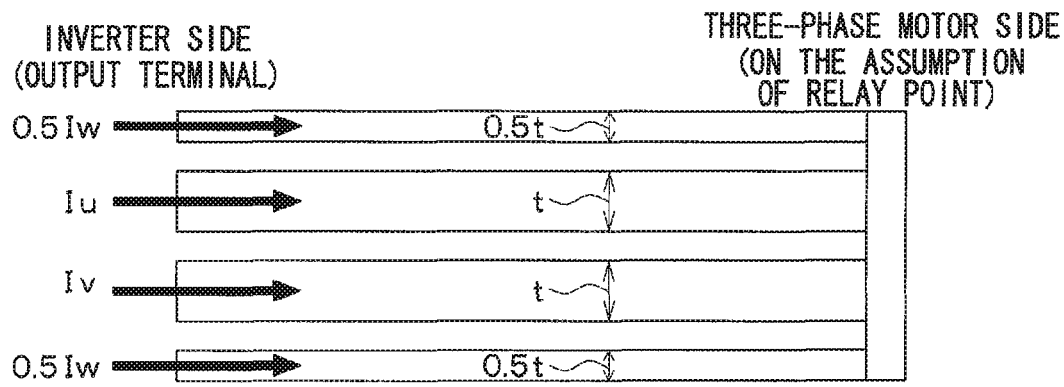
FIG. 14B is a cross-sectional view of a stacked structure of U-phase to W-phase wiring layers used as a specimen.
Figure 14C:
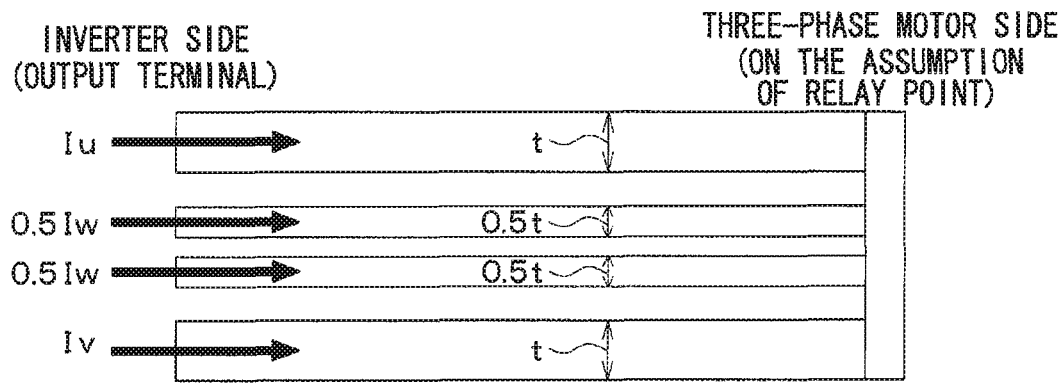
FIG. 14C is a cross-sectional view of a stacked structure body of U-phase to W-phase wiring layers used as a specimen.
Figure 15A:
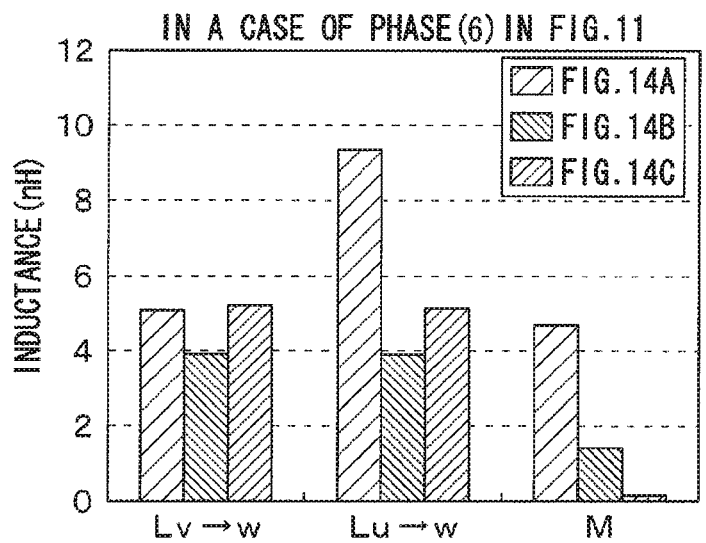
FIG. 15A is a graph showing results of investing inductances at a timing (6) in FIG. 11 using the specimens shown in FIG. 14A to FIG. 14C.
Figure 15B:
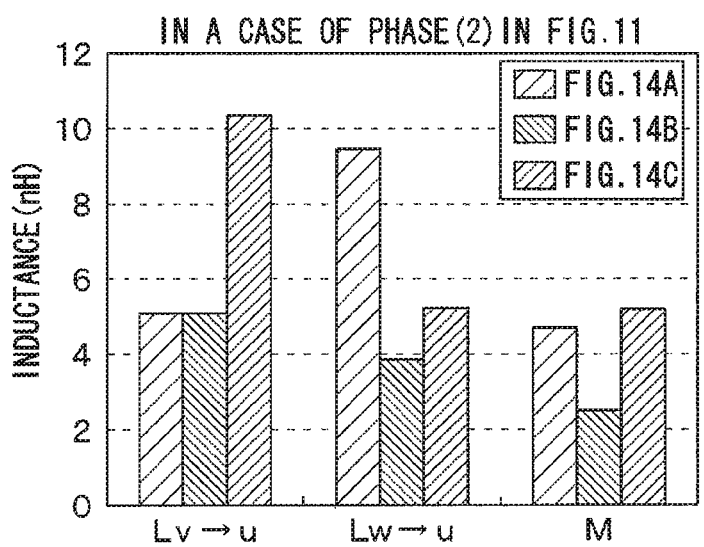
FIG. 15B is a graph showing results of investing inductances at a timing (2) in FIG. 11 using the specimens shown in FIG. 14A to FIG. 14C.
Figure 15C:
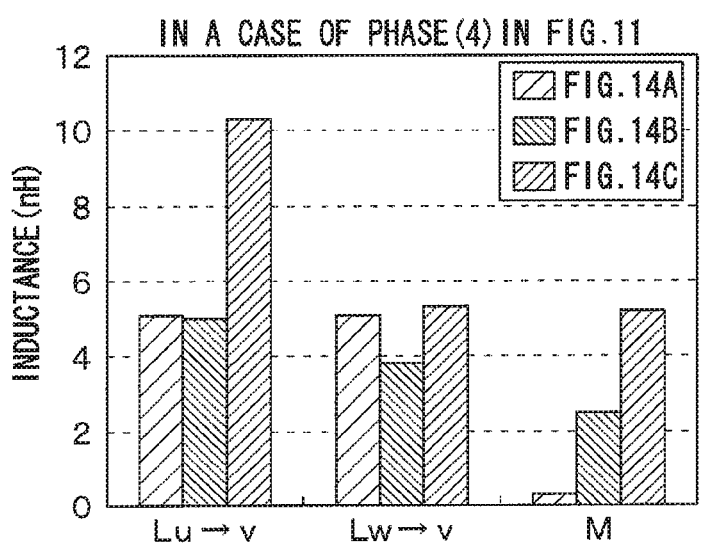
FIG. 15C is a graph showing results of investing inductances at a timing (4) in FIG. 11 using the specimens shown in FIG. 14A to FIG. 14C.

Specifically, a change of an inductance is investigated for three structures shown in FIG. 14A to FIG. 14C. In FIG. 14A, the U-phase to W-phase wiring layers 133-135 are formed into a three-layer structure. In FIG. 14B, like the present embodiment, the W-phase wiring layer 135a, the U-phase wiring layer 133, the V-phase wiring layer 134, the W-phase wiring layer 135b are arranged in order to form a four-layer structure. In FIG. 14C, the U-phase wiring layer 133, the W-phase wiring layer 135a, the W-phase wiring layer 135b, the V-phase wiring layer 134 are arranged in order to form a four-layer structure. For each of the structures, a change of the inductance is investigated at each of timings (2), (4), (6) in FIG. 11. A change due to an inductive load of the motor is omitted. As a result, results shown in FIG. 15A to FIG. 15C are obtained. The length L, the with W, the thickness t of each of the wiring layers are set to the reference values described in FIG. 12, and the thicknesses of the W-phase wiring layers 135a, 135b divided into two layers are set to ½ of the thicknesses t of the U-phase wiring layer 133 and the V-phase wiring layer 134.

As known from FIG. 15A to FIG. 15C, basically, when large opposite direction currents flow between adjacent wiring layers, a magnetic-flux counteracting effect is large, and thereby the inductance becomes small. For example in FIG. 15C, while both inductances Luv, Lvw are low in the structure in FIG. 14A, the inductances Luv, Lwu are large in the structure in FIG. 14A. In the structure in FIG. 14A, the magnetic-flux counteracting effect is likely to work in a case where a large electric current (ratio 1.0) flows into the V-phase in the middle layer (sandwiched position). However, in a case where a large electric current (ratio 1.0) flows into the U, W-phases at both ends, the magnetic flux counteracting effect is less likely to work. Thus, it is difficult to reduce the inductance in any phase state only by simply stacking the wiring layers. In the structure in FIG. 14C, the inductances of Lvu and Luv in FIG. 15B, FIG. 15C are high. Thus, the inductance reduction effect depends on stacking ways even in four-layer structures.

As compared with this, in FIG. 14B, the inductance reduction effect becomes the maximum by employing the four-layer structure and the optimal stacking way. The inductances become small at all timings and all electric current paths, and the change amounts are small. Because the magnetic fluxes generated by electric currents that flow separately are small, as a result, the mutual inductance M also becomes small.

In this way, the four-layer structure can reduce the inductance, and like the present embodiment, a structure in which one of the wiring layers divided into two layers (e.g., the W-phase wiring layer 135a), another wiring layer (e.g., the U-phase wiring layer 133), another wiring layer (e.g., the V-phase wiring layer 134), and the other of the wiring layers divided into two layers (e.g., the W-phase wiring layer 135b) are arranged in order can especially reduce the inductance. Accordingly, the output terminal inductance of the electric current supply path to the load 3 using the U to W terminals 13c-13e as output terminals can be reduced.

Figure 16A:
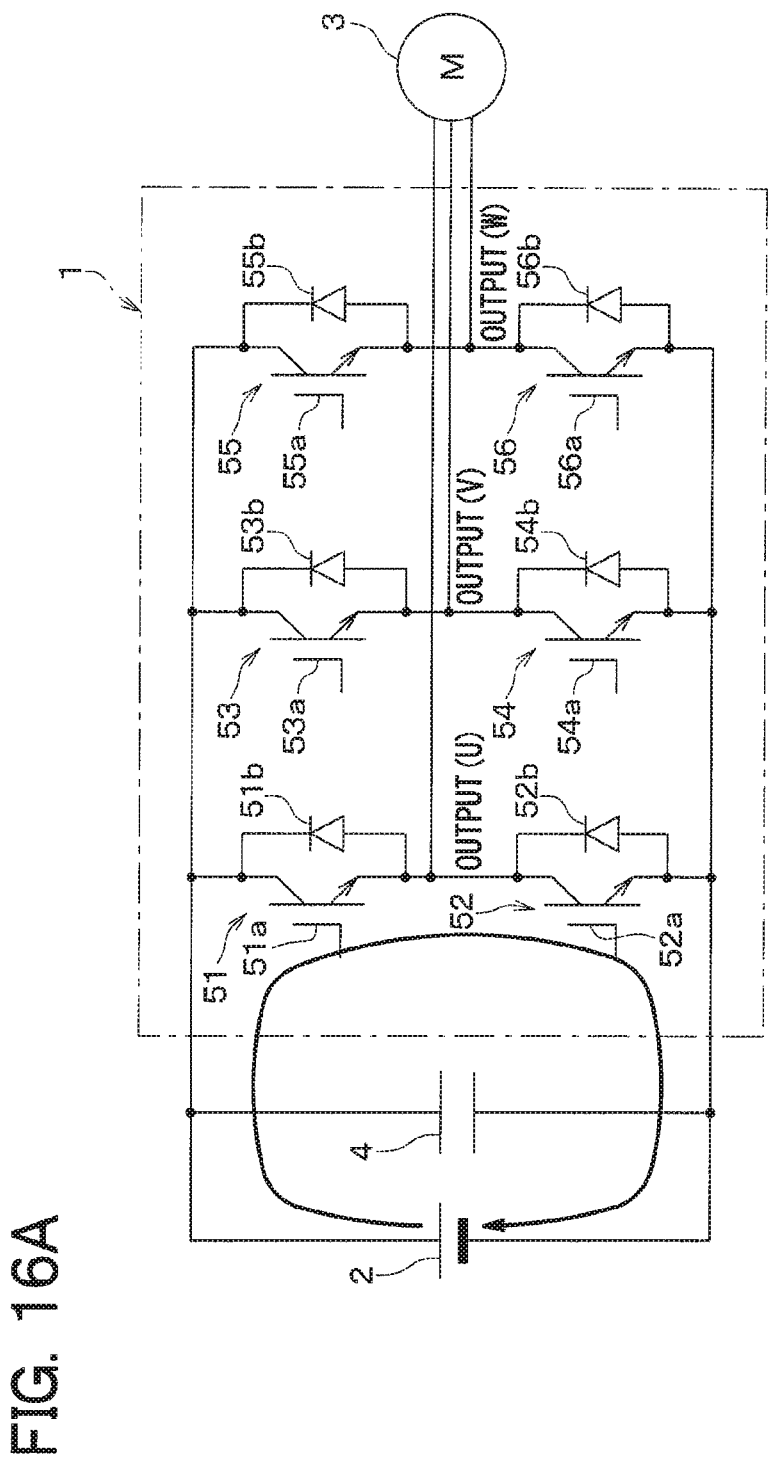
FIG. 16A is a circuit diagram showing a state of a series-arm short circuit.

For example, due to an erroneous-on by a failure of a driving circuit that drives the semiconductor module 6 from outside or unexpected noise, as shown by the arrow in FIG. 16A, the upper and lower arms 51-56 in the same phase are turned on at the same time, and a series-arm short circuit that forms a short-circuit path not through the load 3 may be generated. In this case, because an excessive electric current flows when short circuits of the upper and lower arms 51-56 occur, if the main circuit inductance is large, an excessive surge (noise) is generated, and a further malfunction or failure may be caused.

Figure 16B:
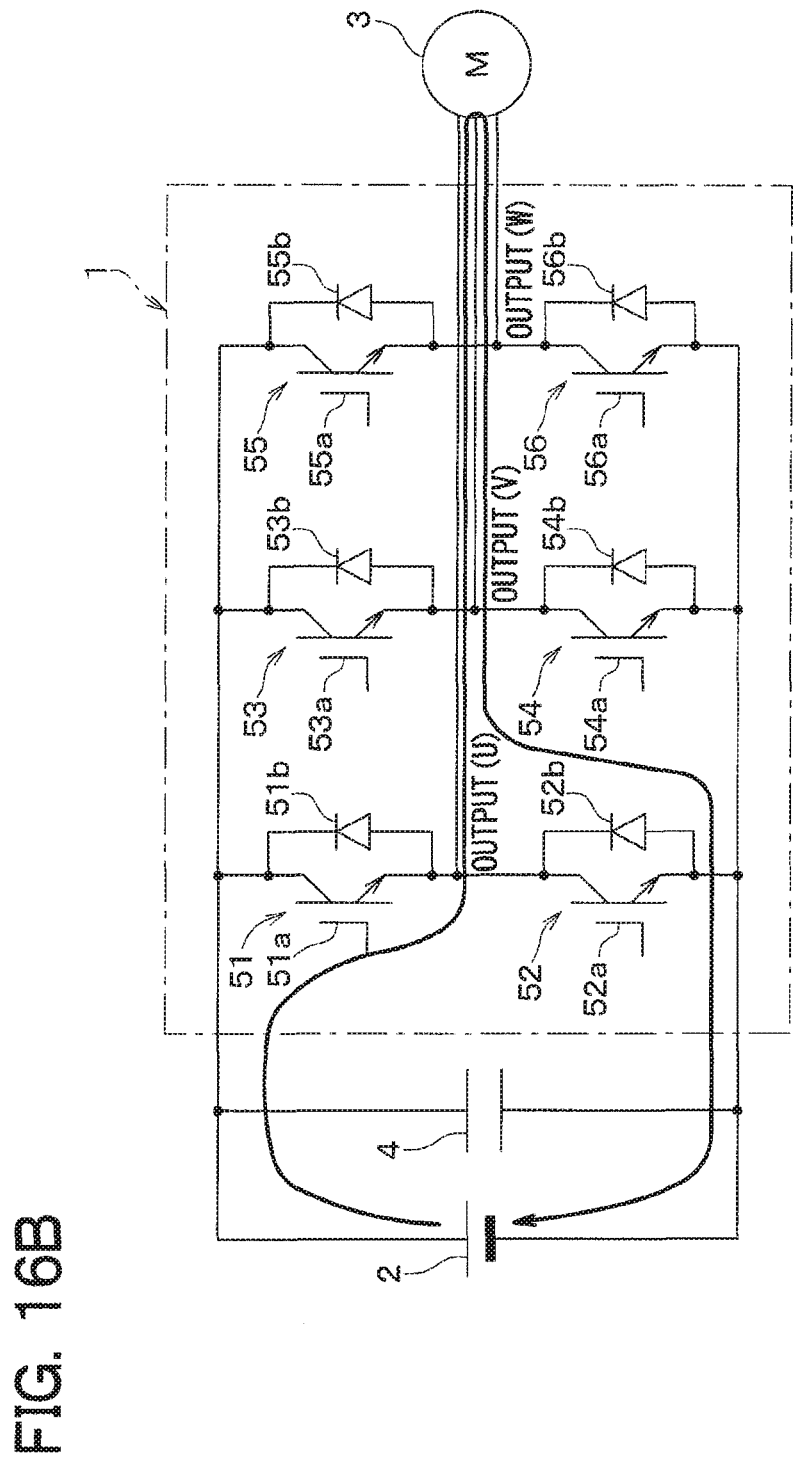
FIG. 16B is a circuit diagram showing a state of an output short circuit.

In addition, due to a dielectric breakdown of the inductive load 3, as shown by the arrow in FIG. 16B, an output short circuit that forms a short-circuit path at somewhere before passing through the load 3 may occur. In this case, although the upper and lower arms 51-56 are normally driven, because an electric current flows without passing through the load 3, an excessive electric current may be generated in a manner similar to the series-arm short circuit. A fixed time is required before the excessive electric current is detected in the driving circuit of the semiconductor module 6 and the upper and lower arms 51-56 are turned off, and if the output terminal inductance is large, a generated magnetic flux (noise) causes a malfunction of the driving circuit, and as a result, a breakdown of the semiconductor switching elements 51a-56a is caused.

On the other hand, in the semiconductor module 6 according to the present embodiment, the main circuit inductance and the output terminal inductance can be reduced. Thus, because the main circuit inductance is reduced, a generation of an excessive surge can be restricted when a series-arm short circuit occurs, and a further malfunction or failure can be restricted. In addition, because the output terminal inductance is reduced, a malfunction of the driving circuit due to the magnetic flux (noise) generated when an output terminal short-circuit occurs can be restricted, and the semiconductor switching elements 51a-56a can be protected from breakdown.

Furthermore, in the semiconductor module 6 according to the present embodiment, the positive electrode wiring layers 131 and the negative electrode wiring layers 132 are formed into the stacked structure and the U-phase to W-phase wiring layers 133-135 are formed into the stacked structure by using the multilayer wiring bus bar 13. In addition, the control terminals 14 of the upper arms 51, 53, 55 and the control terminals 14 of the lower arms 52, 54, 56 are exposed from the two opposed sides of the resin mold portion 18 formed into the quadrangular plate shape. Then, the both ends of the multilayer wiring bus bar 13 are exposed from the other two opposed sides of the resin mold portion 18 formed into the quadrangular plate shape so that the control terminals 14 and the both ends of the multilayer wiring bus bar 13 are kept at distances.

Thus, compared with a case in which the control terminals 14, the positive and negative electrode terminals 13a, 13b, and the U to W terminals 13c-13e are arranged laterally, a noise can be reduced between the multilayer wiring bus bar 13 in which a large current flows and the control terminals 14 that transmits various signals. The following describes about this with reference to FIG. 17 to FIG. 20.

Figure 17A:
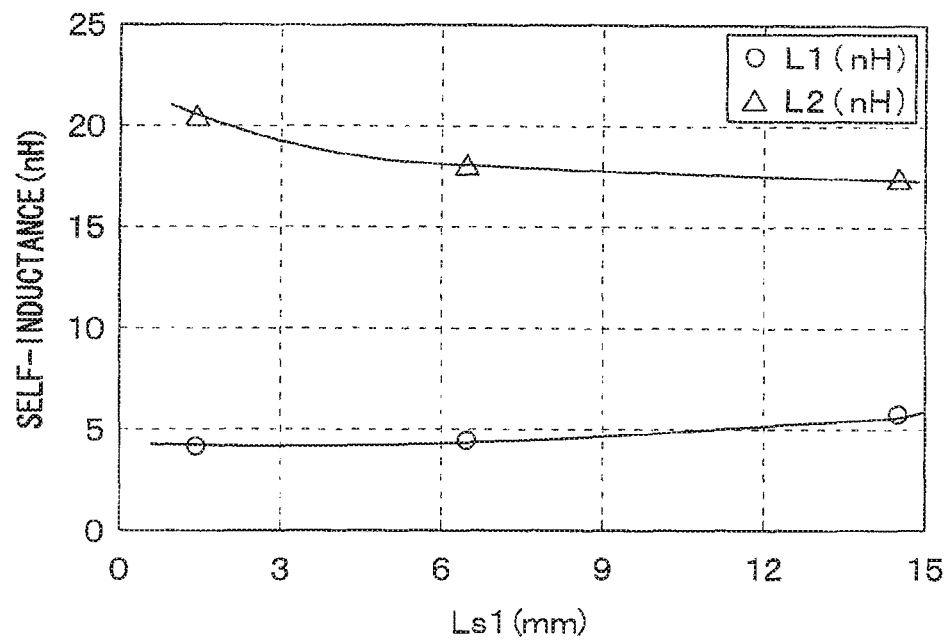
FIG. 17A is a graph showing results of investing self-inductances L1, L2 with respect to a distance Ls1.
Figure 17B:
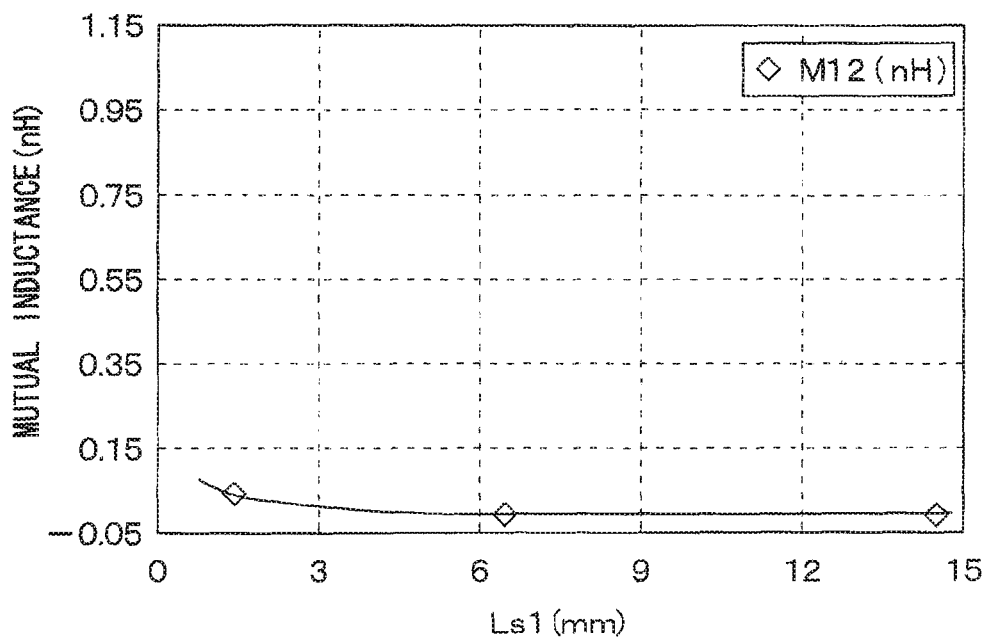
FIG. 17B is a graph showing results of investing a mutual inductance M12 with respect to the distance Ls1.
Figure 18:
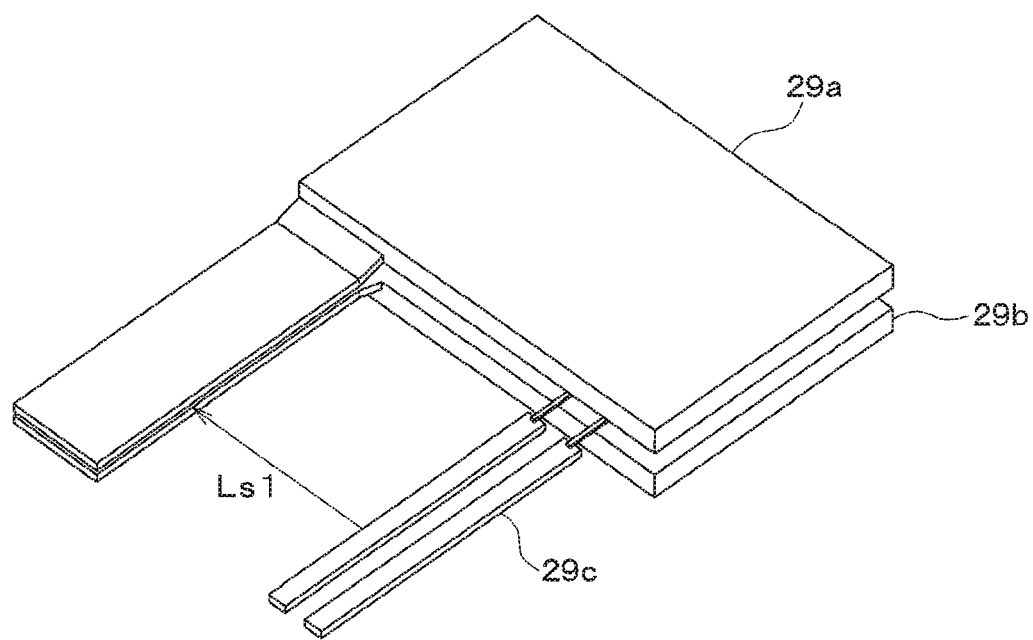
FIG. 18 is a perspective view of a specimen used for the investigation in FIG. 17A and FIG. 17B.

FIG. 17A and FIG. 17B show results of investing an inductance when power terminals 29a, 29b in which a large electric current flows are arranged opposite to each other in a vertical direction and a distance Ls1 between the power terminals 29a, 29b and control terminals 29c is changed as shown in FIG. 18 as a specimen. In FIG. 17A, L1 indicates a self-inductance of the power terminals 29a, 29b (corresponding to the main circuit inductance), and L2 indicates a self-inductance of the control terminals 29c as signal lines. In addition, M12 in FIG. 17B indicates a mutual inductance of the power terminals 29a, 29b and the control terminals 29c.

As clear from these figures, because the power terminals 29a, 29b are stacked, the self-inductance L1, which becomes a noise source, is small. In addition, even if the power terminals 29a, 29b are disposed adjacent to the control terminals 29c, an influence is small. This means that because a magnetic flux on an L1 path becomes small by stacking the power terminals 29a, 29b, an induced electromotive force of an L2 path is less likely to be generated. Thus, the mutual inductance M12 as its index is small, and the influence to the control terminals 20c is small even if the power terminals 29a, 29b are disposed adjacent to the control terminals 29c.

Figure 19A:
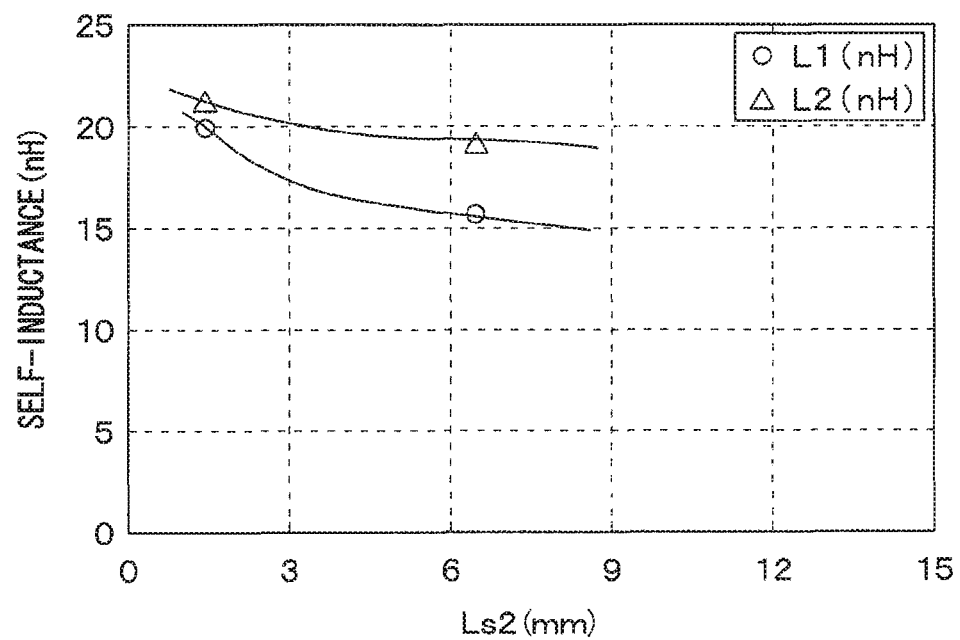
FIG. 19A is a graph showing results of investing self-inductances L1, L2 with respect to a distance Ls2.
Figure 19B:
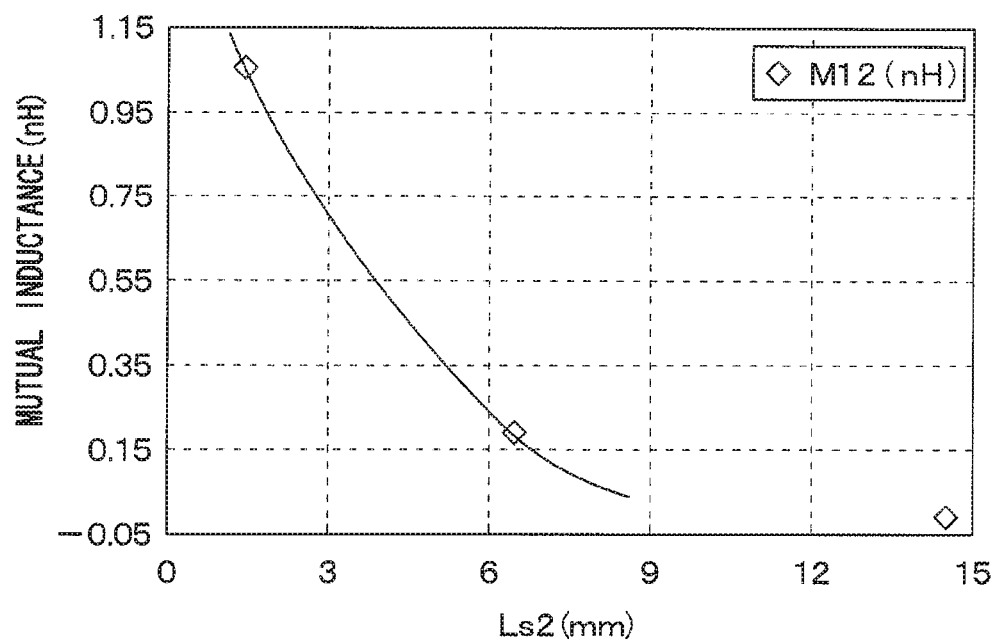
FIG. 19B is a graph showing results of investing a mutual inductance M12 with respect to the distance Ls1.
Figure 20:
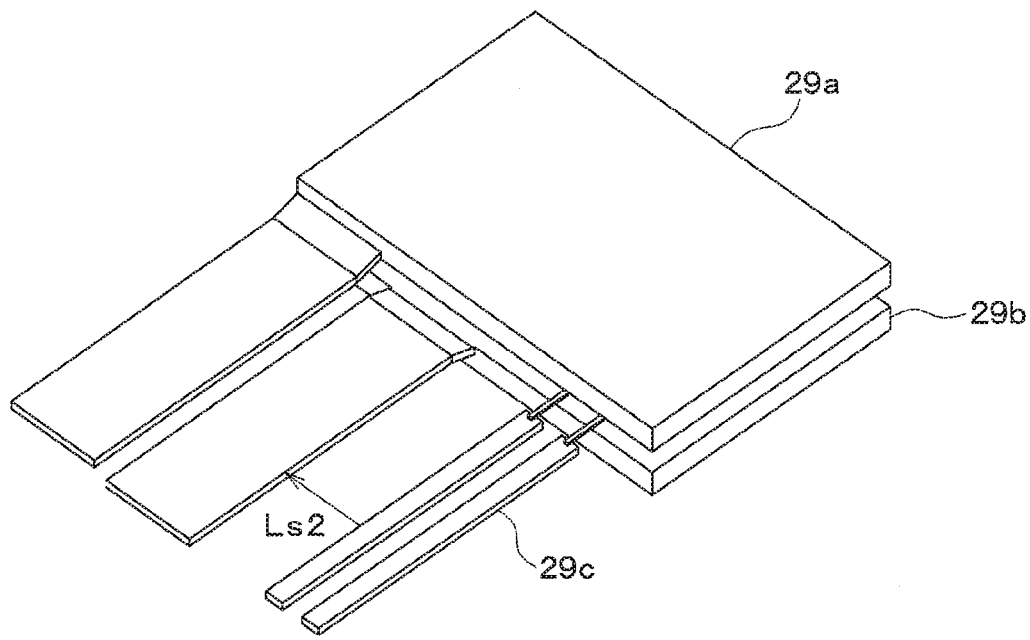
FIG. 20 is a perspective view of a specimen used for the investigation in FIG. 19A and FIG. 19B.

FIG. 19A and FIG. 19B show a result of investing an inductance when the power terminals 29a, 29b in which a large electric current flows are arranged at a distance so as not to be opposed to each other as a specimen, and a distance Ls2 between the power terminals 29a, 29b and the control terminals 20c is changed as shown in FIG. 20 as a specimen. L1, L2 in FIG. 19A and M12 in FIG. 19B are similar to those in FIG. 17A and FIG. 17B.

As clear from these figures, because the power terminals 29a, 29b are not stacked, the self-inductance L1, which becomes a noise source, is large. In addition, an influence is large when the power terminals 29a, 29b are disposed adjacent to the control terminals 29c. On the other hand, because the power terminals 29a, 29b are not stacked, the mutual inductance M12 is also large, and the influence to the control terminals 29c is large if the power terminals 29a, 29b are disposed adjacent to the control terminals 29c. Thus, if a state in which a large current is turned on and off with the power terminals 29a, 29b occurs, an unintentional electromotive force is generated in the driving circuit and a malfunction is caused.

In order to reduce the inductance, it is effective to form each of the components of the positive electrode wiring and each of the components of the negative electrode wiring by parallel conductors so that electric currents flow in opposite directions in the positive electrode and the negative electrode. Accordingly, a magnetic offsetting occurs between the positive electrode wiring and the negative electrode wiring, and the inductance can be reduced.

In the semiconductor module 6 according to the present embodiment, the positive electrode wiring layers 131 and the negative electrode wiring layers 132 are formed into the stacked structure, and the U-phase to W-phase wiring layers 133-135 are formed into the stacked structure by using the multilayer wiring bus bar 13. Thus, the self-inductance which becomes the noise source can be reduced, the influence to the control terminals 14 is reduced, and a malfunction of the driving circuit for driving the semiconductor module 6 can be restricted.

In addition that the influence to the control terminals 14 can be reduced by the stacked structure, the control terminals 14 and the both ends of the multilayer wiring bus bar 13 are drawn out from the four sides of the resin mold portion 18. Thus, these components can be kept away from each other, and a malfunction of the driving circuit for driving the semiconductor module 6 can be further restricted.

Other Embodiments

The present disclosure is not limited to the above-described embodiments and may be suitably modified.

For example, in a case where each of the positive electrode wiring layers 131 and the negative electrode wiring layers 132 that constitute the main circuit are divided into two layers, and the thicknesses of the negative electrode wiring layer 131a and the negative electrode wiring layer 132b are set to 1, the thicknesses of the positive electrode wiring layer 131b and the negative electrode wiring layer 132a are set to 0.5. However, this is merely an example, and an object is to set the stacked layer number to be an even number. Thus, the thickness of the layers are optional. For example, in a case where the thicknesses of the positive electrode wiring layer 131a and the negative electrode wiring layer 132b are set to 1, the thicknesses t of the positive electrode wiring layer 131b and the negative electrode wiring layer 132a may be set to 0.6. However, it is preferable to set cross-section areas of portions in the U-phase to W-phase wiring layers 133-135 in which electric currents pass to be the same. Thus, in a case where the positive electrode wiring layer 131 and the negative electrode wiring layer 132 are formed by the same internal layer wiring as the U-phase to W-phase wiring layers 133-135, it is preferable to set the thicknesses of the above-described embodiment.

In addition, in the above-described embodiment, the U-phase to W-phase wiring layers 133-135 are formed into the four-layer structure while the positive electrode wiring layers 131 and the negative electrode wiring layers 132 are formed into the four-layer structure. However, because the stacked layer number only have to be an even number, for example, each of the U-phase to W-phase wiring layers 133-135 may be divided into two layers so that the total stacked layer number is six. In this case, for example, a structure in which the U-phase to W-phase wiring layers 133-135 are stacked in order can be employed.

In addition, the multilayer wiring bus bar 13 in which a main circuit side bus bar forming the positive and negative electrode terminals 13a, 13b, the positive electrode wiring layer 131, and the negative electrode wiring layer 132 and an output terminal side bus bar forming the U to W terminals 13c-13e and the U-phase to W-phase wiring layers 133-135 are integrated is taken as an example. However, the main circuit side bus bar and the output terminal side bus bar may be formed by separate bus bars.

In the above-described embodiment, a mode in which the positive electrode side of the direct-current power source 2 that becomes the external power source and the positive electrode terminal 13a, and the negative electrode side of the direct-current power source 2 and the negative electrode terminal 13b are directly connected. However, the positive electrode terminal 13a is a terminal to which a voltage is applied from the external power source, and the negative electrode terminal 13b is a terminal connected to a low potential point. Thus, an element such as a resistor may be provided between the positive electrode terminal 13a and the external power source or the negative electrode terminal 13b and the ground potential point.

The invention claimed is:

1. A semiconductor module comprising:
upper arms and lower arms for three phases, each of the upper arms and the lower arms including a semiconductor chip in which a semiconductor switching element is formed, the semiconductor chip having a front surface and a rear surface;
heat sinks respectively disposed to the front surface and the rear surface of the semiconductor chip in each of the upper arms and the lower arms;
a main circuit side bus bar forming a main circuit that includes a positive electrode wiring layer connected to positive electrode sides of the semiconductor chips in the upper arms, a positive electrode terminal for electrically connecting the positive electrode wiring layer and a positive electrode side of an external power source, a negative electrode wiring layer disposed opposite to the positive electrode wiring layer via an insulating layer and connected to negative electrode sides of the semiconductor chips in the lower arms, and a negative electrode terminal for electrically connected with the negative electrode wiring layer;

an output terminal side bus bar including an output wiring layer connected to negative electrode sides of the semiconductor chips in the upper arms and positive electrode sides of the semiconductor chips in the lower arms so as to be connected to middle potential points of the upper arms and the lower arms and an output terminal electrically connecting the output wiring layer and a load;

a control terminal that becomes a signal line of the semiconductor switching elements; and a resin mold portion covering the upper arms and the lower arms while exposing one surface of each of the heat sinks, an end portion of the main circuit bus bar adjacent to the positive electrode terminal and the negative electrode terminal, an end portion of the output terminal side bus bar adjacent to the output terminal, and an end portion of the control terminal, wherein the output wiring layer includes a U-phase wiring layer, a V-phase wiring layer, and a W-phase wiring layer electrically connected with the middle potential point of the upper arm and the lower arm in each of the three phases, the U-phase wiring layer, the V-phase wiring layer, and the W-phase wiring layer are stacked vertically and imbedded in an insulating layer and are electrically insulated from each other via the insulating layer being interposed between each of the U-phase wiring layer, the V-phase wiring layer, and the W-phase wiring layer, the output terminal includes a U terminal, a V terminal, and a W terminal electrically connecting each of the U-phase wiring layer, the V-phase wiring layer, and the W-phase wiring layer and the load, and a stacked layer number of the U-phase wiring layer, the V-phase wiring layer, and the W-phase wiring layer is set to be an even number.

2. The semiconductor module according to claim 1, wherein
the output terminal side bus bar and the main circuit side bus bar are integrated into a multilayer wiring bus bar.

3. The semiconductor module according to claim 2, wherein
a stacked layer number of the positive electrode wiring layer and the negative electrode wiring layer is same as the stacked layer number of the U-phase wiring layer, the V-phase wiring layer, and the W-phase wiring layer.

4. The semiconductor module according to claim 2, wherein
the stacked layer number of the U-phase wiring layer, the V-phase wiring layer, and the W-phase wiring layer is four, and one of the U-phase wiring layer, the V-phase wiring layer, and the W-phase wiring layer is divided into two layers.

5. The semiconductor module according to claim 4, wherein
another of the U-phase wiring layer, the V-phase wiring layer, and the W-phase wiring layer is disposed between the one of the U-phase wiring layer, the V-phase wiring layer, and the W-phase wiring layer divided into two layers.

6. The semiconductor module according to claim 2, wherein the end portion of the main circuit bus bar adjacent to the positive electrode terminal and the negative electrode terminal and the end portion of the output terminal side bus bar adjacent to the output terminal are exposed from opposed sides of the resin mold portion.

7. The semiconductor module according to claim 6, wherein
the resin mold portion has a quadrangular plate shape, the end portion of the main circuit side bus bar adjacent to the positive electrode terminal and the negative electrode terminal and the end portion of the output terminal side bus bar adjacent to the output terminal are exposed from two opposed sides of the resin mold portion, and an end portion of the control terminal in the upper arms and an end portion of the control terminal in the lower arms are exposed from the other two opposed sides of the resin mold portion.

8. The semiconductor module according to claim 2, wherein
each of the U-phase wiring layer, the V-phase wiring layer, and the W-phase wiring layer is designed so that a width is larger than a thickness.

9. The semiconductor module according to claim 2, wherein
the semiconductor chips in the upper arms and the semiconductor chips in the lower arms are arranged so that the front surfaces face a same direction and the rear surfaces face a same direction, and the multilayer wiring layer bus bar is disposed to pass between the semiconductor chips in the upper arms and the semiconductor chips in the lower arms.

10. The semiconductor module according to claim 9, wherein
the multilayer wiring bus bar is formed of a plate-shaped and rod-shaped member extending from the end portion adjacent to the positive electrode terminal and the negative electrode terminal toward the output terminal, and in a width direction that intersects a longitudinal direction of the multilayer wiring bus bar, on one surface of the multilayer wiring bus bar, a first output electrode electrically connected with front surface electrodes disposed to the front surfaces of the semiconductor chips in the upper arms and the output wiring layer, and a negative electrode electrically connected with front surface electrodes disposed to the front surfaces of the semiconductor chips in the lower arms and the negative electrode wiring layer are formed, on the other surface opposite from the one surface of the multilayer wiring bus bar, a positive electrode electrically connected with rear surface electrodes disposed to the rear surfaces of the semiconductor chips in the upper arms and the positive electrode wiring layer, and a second output electrode connected with rear surface electrodes disposed to the rear surfaces of the semiconductor chips in the lower arms and the output wiring layer are formed, and in a cross section cutting the multilayer wiring bus bar formed into the plate-shaped and rod-shaped member in the width direction, the first output electrode and the second output electrode are disposed on one diagonal and are electrically connected in the multilayer wiring bus bar, and the positive electrode and the negative electrode are disposed on the other diagonal.

* * * * *